United States Patent
Lin et al.

(10) Patent No.: US 11,856,796 B2
(45) Date of Patent: Dec. 26, 2023

(54) SEMICONDUCTOR MEMORY DEVICES AND METHODS OF MANUFACTURING THEREOF

(71) Applicant: Taiwan Semiconductor Manufacturing Company, Ltd., Hsinchu (TW)

(72) Inventors: Meng-Han Lin, Hsinchu (TW); Chia-En Huang, Xinfeng Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 53 days.

(21) Appl. No.: 17/586,351

(22) Filed: Jan. 27, 2022

(65) Prior Publication Data

US 2023/0012701 A1    Jan. 19, 2023

Related U.S. Application Data

(60) Provisional application No. 63/222,526, filed on Jul. 16, 2021.

(51) Int. Cl.
*H01L 29/423* (2006.01)
*H10B 63/00* (2023.01)
*H01L 21/28* (2006.01)
*G11C 13/00* (2006.01)

(52) U.S. Cl.
CPC ......... *H10B 63/30* (2023.02); *G11C 13/0002* (2013.01); *H01L 21/28158* (2013.01); *H01L 29/42364* (2013.01)

(58) Field of Classification Search
CPC ..... H01L 29/66; H01L 29/423; H01L 29/786; H01L 29/66772; H01L 29/78654; H01L 29/42364; H01L 27/12; H01L 27/24; H01L 27/088; H01L 27/1203; H01L 27/2436; H01L 21/28; H01L 21/28158; H10N 70/00; H10N 70/011; H10B 63/00; H10B 63/30
USPC .............................................................. 257/4
See application file for complete search history.

(56) References Cited

U.S. PATENT DOCUMENTS

| | | | |
|---|---|---|---|
| 2006/0118855 A1* | 6/2006 | Lee ................. | H10B 69/00 257/E21.687 |
| 2008/0315319 A1* | 12/2008 | Asano .............. | H01L 29/945 438/383 |
| 2009/0206339 A1* | 8/2009 | Park ................. | G02F 1/136213 257/E27.06 |

\* cited by examiner

*Primary Examiner* — Chuong A Luu
(74) *Attorney, Agent, or Firm* — FOLEY & LARDNER LLP

(57) ABSTRACT

A semiconductor device includes a lower silicon layer comprising a first area and a second area. The lower silicon layer in the first area includes a first silicon oxide layer, a first upper silicon layer disposed above the first silicon oxide layer, and a first metal gate disposed above the first upper silicon layer. The lower silicon layer in the second area includes a second silicon oxide layer, a plurality of first doped silicon gates disposed above the second silicon oxide layer, and a plurality of portions of a second doped silicon gate disposed above the second silicon oxide layer. The plurality of first doped silicon gates and the plurality of portions of the second doped silicon gate are alternatively arranged with each other. The lower silicon layer in the second area also includes a plurality of second metal gates disposed directly above the plurality of first doped silicon gates, respectively.

10 Claims, 33 Drawing Sheets

SEMICONDUCTOR MEMORY DEVICES AND METHODS OF MANUFACTURING THEREOF

CROSS-REFERENCE TO RELATED APPLICATION

This application claims priority to and the benefit of U.S. Provisional Application No. 63/222,526, filed Jul. 16, 2021, entitled "EMBEDDED RRAM IN HKMG-BASED SOI TECHNOLOGY," which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
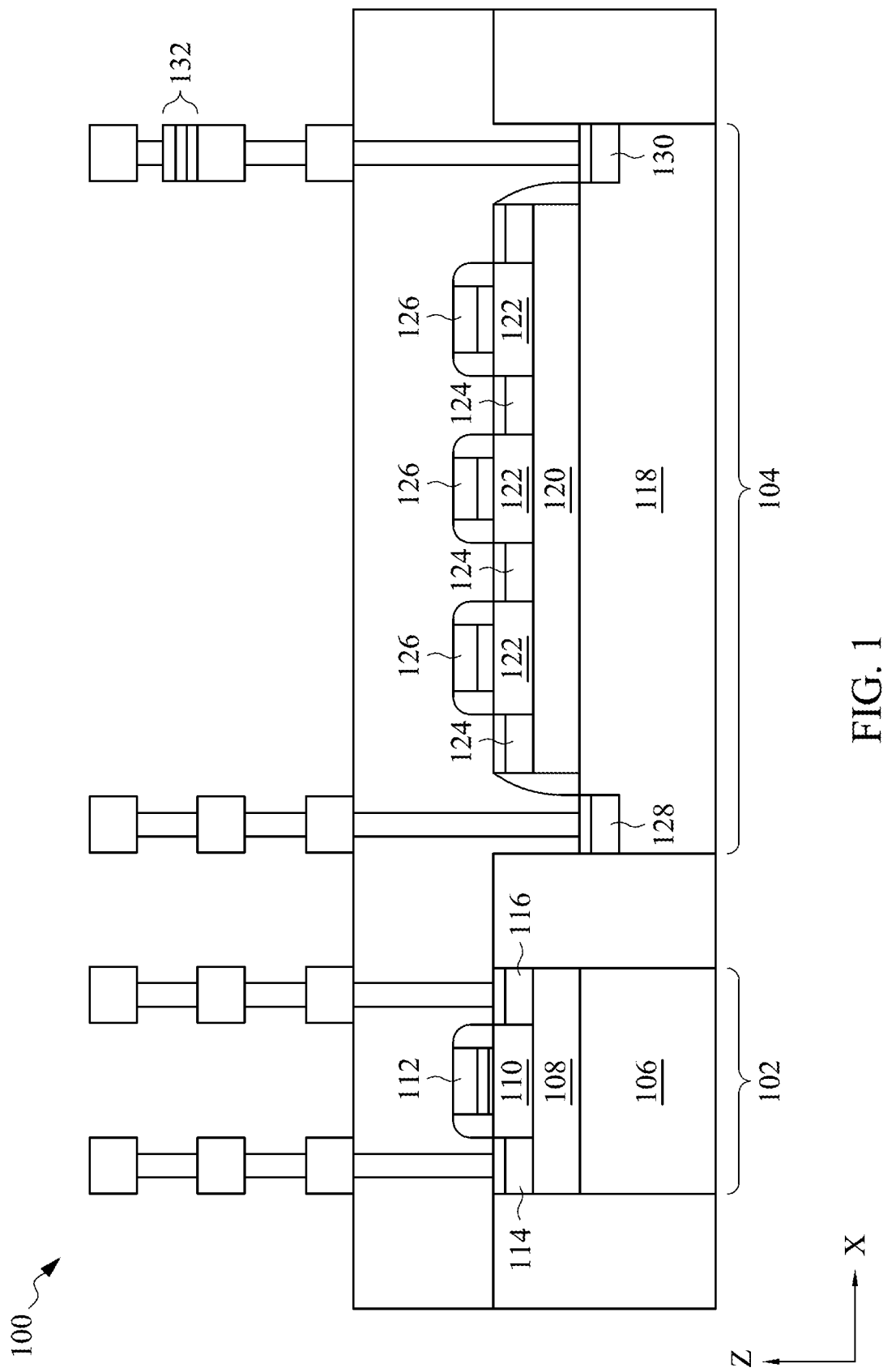
FIG. 1 illustrates a cross-sectional view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

High-k Metal Gate (HKMG) transistor structures are widely used in advanced Complementary Metal-Oxide-Semiconductor (CMOS) technologies thanks to their immunity from poly gate depletion issues and substantially low gate coupling capacitance. In particular, fabricating such HKMG transistors on silicon-on-insulator (SOI) substrates makes it a promising candidate for the next generation wireless communication (e.g., 5G) applications. However, such SOI-based HKMG transistors are typically configured for low-voltage applications (e.g., operating under less than about 1 volt (V)). In order to integrate these HKMG transistors with other devices, configured for some high-voltage applications (e.g., operating with more than about 2V), on a same SOI substrate, various issues may arise. For example, when fabricating the similar HKMG structures for the low-voltage and high-voltage applications, the HKMG structure of a high-voltage transistor, typically formed in a longer length and wider width, suffers from a dishing effect resulting from a polishing process. Even fabricating the HKMG structure of the high-voltage transistor by replacing an upper layer of the SOI substrate, the dishing effect still remains over an interlayer dielectric over the high-voltage transistor. This dishing effect is generally undesirable in the CMOS fabrication. Thus, the existing SOI-based HKMG transistors have not been entirely satisfactory in many aspects.

The present disclosure provides various embodiments of a semiconductor device that includes a low-voltage device portion and a high-voltage device portion formed on a single silicon-on-insulator (SOI) substrate. In the low-voltage device portion, each transistor (low-voltage transistor) may have a HKMG structure, while in the high-voltage device portion, each transistor (high-voltage transistor) may have a plural number of HKMG structures concurrently formed with the HKMG structure of the low-voltage transistor. According to various embodiments of the present disclosure, these HKMG structures of the high-voltage transistor may function as dummy gate structures. For example, instead of electrically gating the high-voltage transistor, a number of poly gate structures, which are replaced by these dummy HKMG structures, may serve as resistant pillars to prevent a dishing effect from being incurred in a polishing process that is desirable for concurrently forming the HKMG structures for the low-voltage and high-voltage transistors, respectively. With such a high-voltage transistor integrated on the same substrate, the semiconductor device, as disclosed herein, can integrate more other types of devices therein. For example, a memory array may be formed to operatively couple to a number of the high voltage transistors. Memory components of the memory array can thus be operated under a relatively high voltage such as, for example, resistive random access memory (RRAM) resistors.

FIG. 1 illustrates a cross-sectional view cut along a first lateral direction (e.g., the X-direction) of a semiconductor device 100, in accordance with various embodiments. The semiconductor device 100 may include at least two types of transistors formed on a single SOI substrate, one of which may be configured for low-voltage application and the other of which may be configured for high-voltage applications. It should be understood that the illustrated embodiment of FIG. 1 is simplified, and thus, the semiconductor device 100 can include any of various other devices or components, while remaining within the scope of the present disclosure.

As shown, the semiconductor device 100 may be formed on a SOI substrate that includes a first area 102 and a second area 104. The SOI substrate, in the first area 102, may include a first lower silicon layer 106, a first silicon oxide layer 108, and a first upper silicon layer 110. The first area 102 may further include a first metal gate structure 112 disposed above the first upper silicon layer 110, a first source region 114, and a first drain region 116. The first upper silicon layer 110, the first source region 114, the first drain region 116, and the first metal gate structure 112 may collectively function as a first transistor which can operate under a relatively low voltage, in some embodiments.

The SOI substrate, in the second area 104, may include a second lower silicon layer 118, a second silicon oxide layer 120, and a plurality of second upper silicon layers 122. The second upper silicon layers 122, doped with a relatively high concentration, may sometimes be referred to as first doped silicon gates. The second area 104 may further include a plurality of second doped silicon gates 124 alternatively arranged with the first doped silicon gates 122. The second area 104 may further include a plurality of second metal gate structures 126 disposed above the first doped silicon gates 122. According to various embodiments of the present disclosure, those second metal gate structures 126 are configured to function as dummy gate structures, which can advantageously prevent a dishing effect from being incurred during a polishing process. The second area 104 may further include a second source region 128 and a second drain region 130 in the second lower silicon layer 118. The second upper silicon layer 118, the second source region 128, the second drain region 130, the first doped silicon gates 122, and the second doped silicon gates 124 may collectively function as a second transistor which can operate under a relatively high voltage, in some embodiments. In some embodiments, the second area 104 may further comprise a memory cell 132 electrically coupled to such a high-voltage transistor through either the second source region 128 or the second drain region 130.

Figure 2:
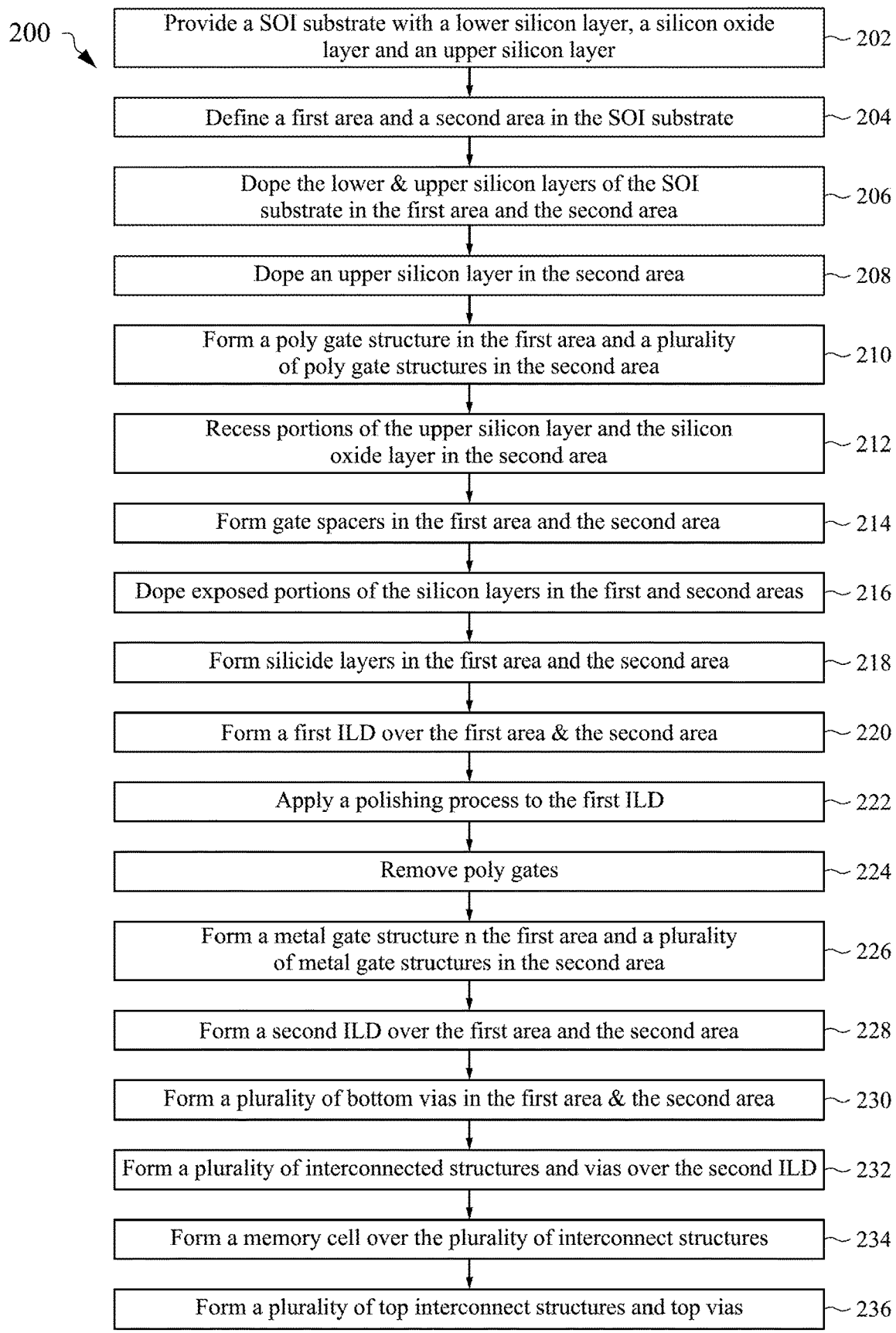
FIG. 2 is an example flow chart of a method for forming a semiconductor device, in accordance with some embodiments.

FIG. 2 illustrates a flowchart of an example method 200 for forming at least a portion of a semiconductor device 300 (e.g., the semiconductor device 100 with respect to FIG. 1), in accordance with some embodiments. It should be noted that the method 200 is merely an example, and is not intended to limit the present disclosure. Accordingly, it is understood that the order of operation of the method 200 of FIG. 2 can change, that additional operations may be provided before, during, and after the method 200 of FIG. 2, and that some other operations may only be described briefly herein. In some embodiments, operations of the method 200 may be associated with cross-sectional views of the example semiconductor device 300 at various fabrication stages as shown in FIGS. 3, 4, 5, 6, 7, 8, 9, 10, 11, 12, 13, 14, 15, 16, 17, 18, 19, 20, and 21.

Further, the method 200 can be used to form one or more transistors in a conduction type such as, for example an n-type transistor or a p-type transistor. The term "n-type," as used herein, may be referred to as the conduction type of a transistor having electrons as its conduction carriers; and the term "p-type," as used herein, may be referred to as the conduction type of a transistor having holes as its conduction carriers.

In a brief overview, the method 200 starts with the operation 202 in which a SOI substrate with a lower silicon layer, a silicon oxide layer, and an upper silicon layer is provided. The method 200 continues to operation 204 in which a first area and a second area are defined in the SOI substrate. The method 200 continues to operation 206 in which the lower and upper silicon layers of the SOI substrate are doped in the first area and the second area. The method 200 continues to operation 208 in which the upper silicon layer is further doped in the second area. The method 200 continues to operation 210 in which a poly gate structure is formed in the first area and a plurality of poly gate structures are formed in the second area. The method 200 continues to operation 212 in which portions of the upper silicon layer and the silicon oxide layer in the second area are recessed. The method 200 continues to operation 214 in which gate spacers are formed in the first area and the second area. The method 200 continues to operation 216 in which exposed portions of the silicon layers are doped in the first and second areas. The method 200 continues to operation 218 in which silicide layers are formed in the first area and the second area. The method 200 continues to operation 220 in which a first ILD is formed over the first area and the second area. The method 200 continues to operation 222 in which a polishing process is applied to the first ILD. The method 200 continues to operation 224 in which poly gates are removed. The method 200 continues to operation 226 in which a metal gate structure is formed in the first area and a plurality of metal gate structures are formed in the second area. The method 200 continues to operation 228 in which a second ILD is formed over the first area and the second area. The method 200 continues to operation 230 in which a plurality of bottom vias are formed in the first area and the second area. The method 200 continues to operation 232 in which a plurality of interconnect structures and vias are formed over the second ILD. The method 200 continues to operation 234 in which a memory cell is formed over the plurality of interconnect structures. The method 200 continues to operation 236 in which a plurality of top interconnect structures and top vias are formed.

Figure 3:
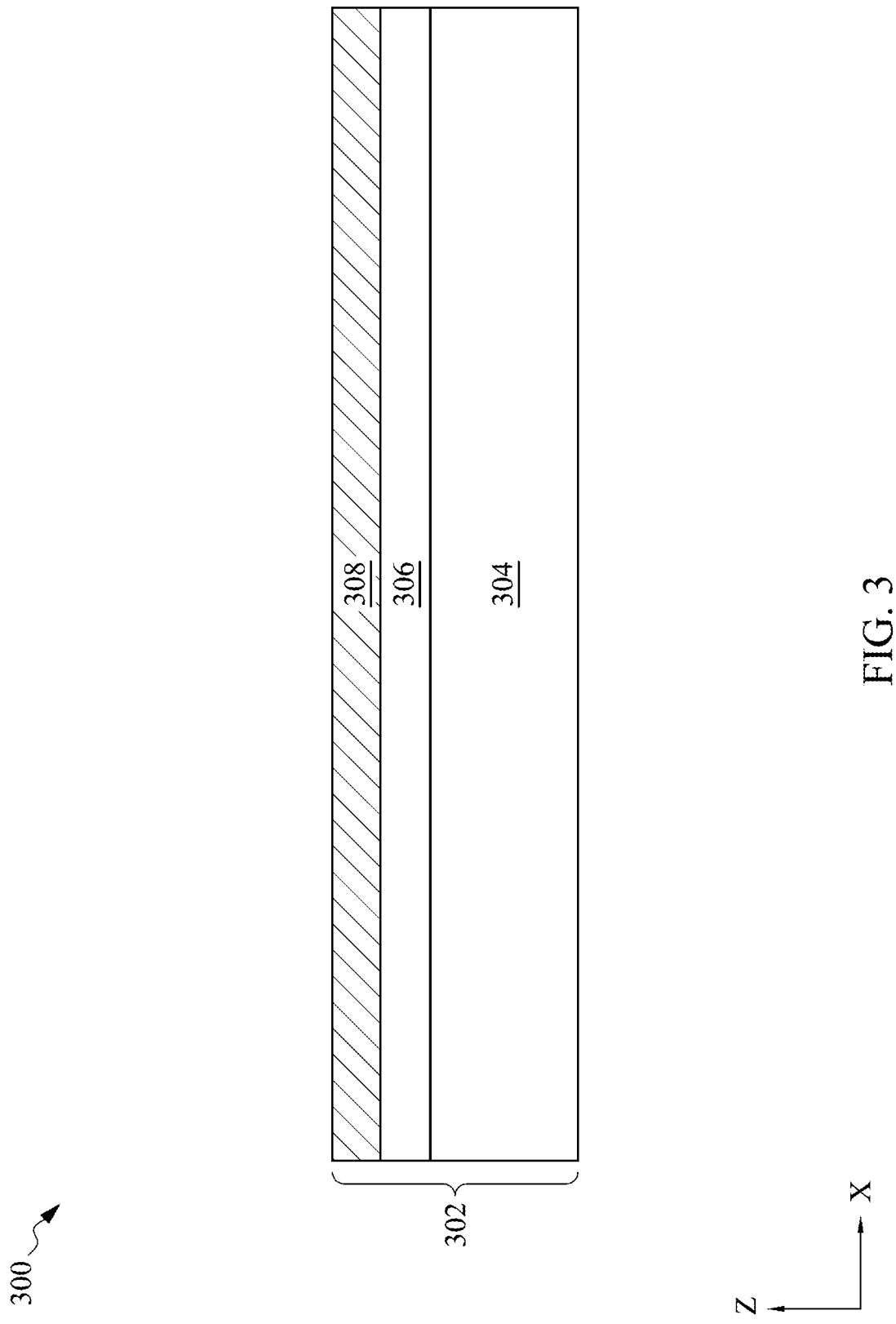
FIGS. 3, 4, 5, 6, 7, 8, 9, 10, 11, 12, 13, 14, 15, 16, 17, 18, 19, 20, and 21 illustrates cross-sectional views of an example semiconductor device (or a portion of the example semiconductor device) during various fabrication stages, made by the method of FIG. 2, in accordance with some embodiments.

Corresponding to operation 202 of FIG. 2, FIG. 3 is a cross-sectional view cut along the X-direction of a semiconductor device 300 including a SOI substrate 302, in accordance with some embodiments.

The silicon-on-insulator (SOI) substrate 302 may include a first layer 304 of a semiconductor material, an insulator layer 306 disposed on the first layer 304, and a second layer 308 of the same semiconductor material as the first layer 304. The insulator layer 306 may be, for example, a buried oxide (BOX) layer, a silicon oxide layer, or the like. The insulator layer 306 may be provided on the first layer 304, typically a silicon or glass substrate. Other substrates, such as a multi-layered or gradient substrate may also be used as the first layer 304. In some embodiments, the semiconductor material of the second layer 308 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other materials are within the scope of the present disclosure.

Figure 4:
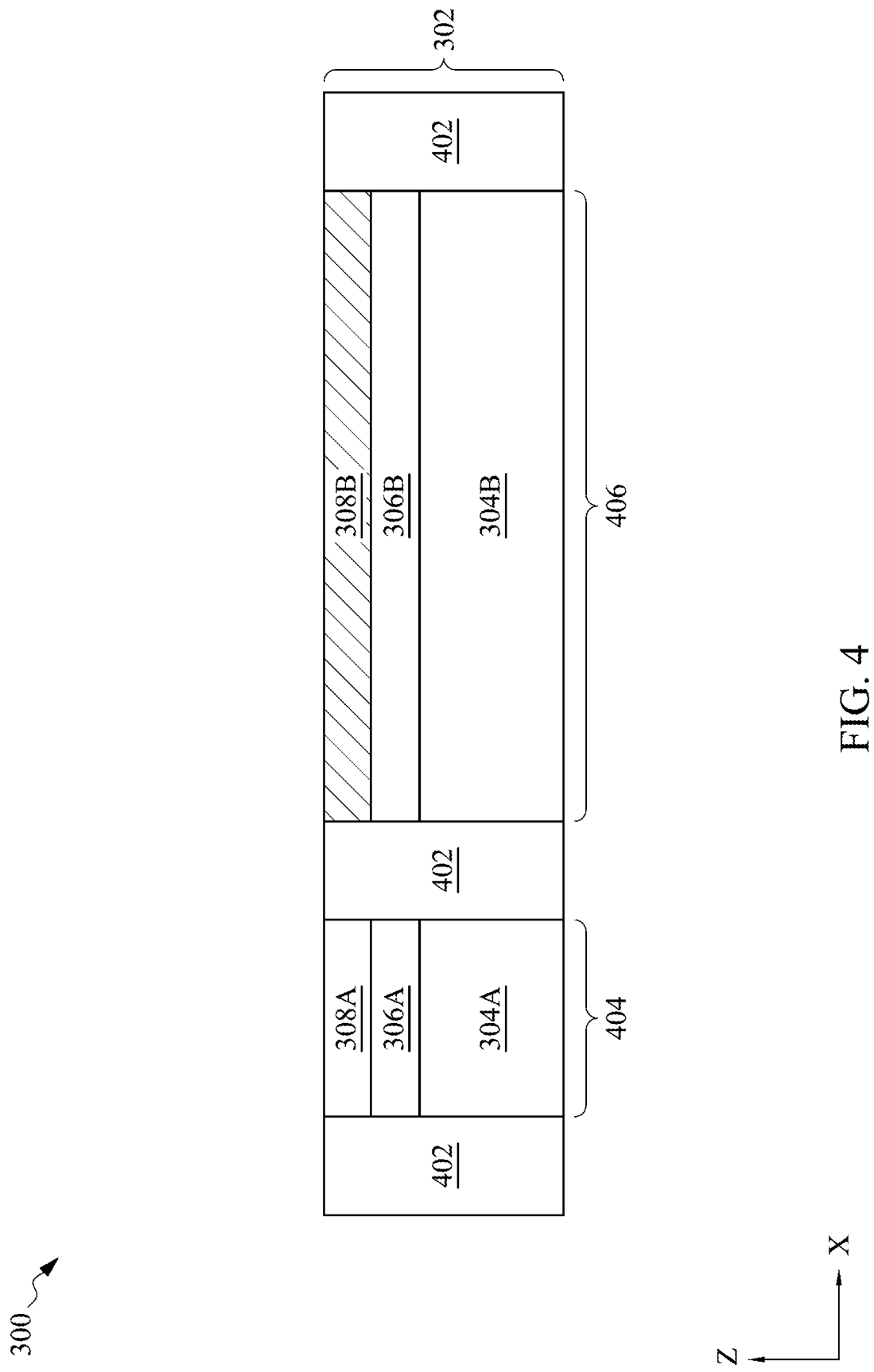

Corresponding to operations 204 and 206 of FIG. 2, FIG. 4 is a cross-sectional view cut along the X-direction of the semiconductor device 300 in which a first area 404 and a second area 406 are defined, in accordance with various embodiments.

Corresponding to operation 204, the first area 404 and second area 406 can be defined (or enclosed) by forming a number of isolation structures 402, as shown in FIG. 4. The isolation structures 402 can be formed by first recessing the SOI substrate 302, filling the recesses with an insulation material, and polishing the workpiece to remove excessive insulation material. Such isolation structures 402 are sometimes referred to as shallow trench isolations (STIs). The isolation structures 402, formed of the insulation material, can electrically isolate neighboring areas of the SOI substrate, e.g., the first area 404 and the second area 406. For example, one or more of the isolation structures 402 can laterally surround the first area 404, and one or more of the isolation structures 402 can laterally surround the second area 406, when viewed from the top.

The insulation material may be an oxide, such as silicon oxide, a nitride, the like, any other suitable material, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, any other suitable method, or combinations thereof. Other insulation materials and/or other formation processes may be used. In an example, the insulation material is silicon oxide formed by a FCVD process. An anneal process may be performed once the insulation material is formed. As mentioned above, a polishing (or planarization) process, such as a chemical mechanical polish (CMP) process or any other suitable process, is performed to remove any excess insulation material and form top surfaces of the isolation structures 402 to be level with each other.

After the formation of the isolation structures 402, the first area 404 may include a first lower silicon layer 304A, a first silicon oxide layer 306A, and a first upper silicon layer 308A. The second area 406 may include a second lower silicon layer 304B, a second silicon oxide layer 306B, and a second upper silicon layer 308B. The first lower silicon layer 304A and the second lower silicon layer 304B may be laterally coplanar with each other. The first silicon oxide layer 306A and the second silicon oxide layer 306B may be laterally coplanar with each other. The first upper silicon layer 308A and the second upper silicon layer 308B may be laterally coplanar with each other.

Corresponding to operation 206, the first lower silicon layer 304A, the second lower silicon layer 304B, the first upper silicon layer 308A, and the second upper silicon layer 308B may be doped with a first type of dopants in a first concentration. For example, to form n-type transistors configured in the enhancement (inversion) mode for the semiconductor device 300, each of the first lower silicon layer 304A and the first upper silicon layer 308A or the second lower silicon layer 304B and the second upper silicon layer 308B may be silicon doped with a p-type dopant such as boron (B), aluminum (Al), indium (In), gallium (Ga), or any other suitable p-type dopants. To form p-type transistors configured in the enhancement (inversion) mode for the semiconductor device 300, each of the first lower silicon layer 304A and the first upper silicon layer 308A or the second lower silicon layer 304B and the second upper silicon layer 308B may be silicon doped with an n-type dopant such as phosphorus (P), arsenic (As), antimony (Sb), or any other suitable n-type dopants.

Figure 5:
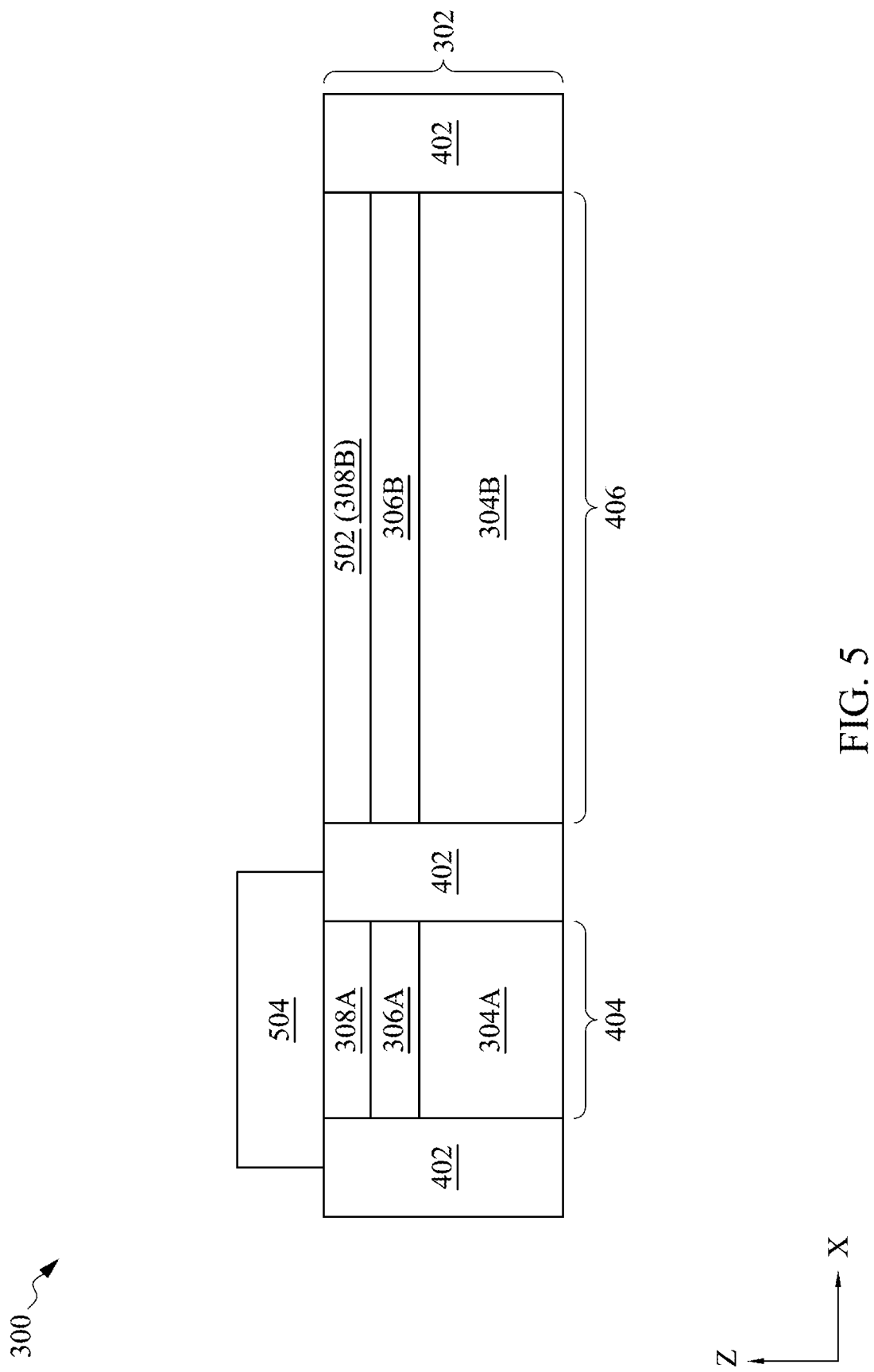

Corresponding to operation 208 of FIG. 2, FIG. 5 is a cross-sectional view cut along the X-direction of the semiconductor device 300 in which the second upper silicon layer 308B is doped with a second type of dopants in a second concentration to form a (blanket) first doped silicon gate 502, in accordance with various embodiments.

To dope the second upper silicon layer 308B, a patterned layer (e.g., a photoresist layer) 504 may be formed to overlay the first area 404 of the semiconductor device 300. The patterned layer 504 protects the underlying material, such as the first upper silicon layer 308A and the first lower silicon layer 304A of the first area 404, while processing the second area 406. With the patterned layer 504, the second upper silicon layer 308B may be doped with a second type of dopants (e.g., opposite to the dopant types in layers 304A, 308A, 304B, and 308B) in a second concentration. Further, the second concentration may be substantially higher than the first concentration (in layers 304A, 308A, 304B, and 308B), thereby causing the second upper silicon layer 308B to function as a doped silicon gate, which will be discussed below.

Continuing with the above example where the transistors (in the second area 406) of the semiconductor device 300 are configured as n-type in the enhancement mode, the second upper silicon layer 308B may be doped with an n-type dopant such as phosphorus (P), arsenic (As), antimony (Sb), or any other suitable n-type dopants. If the transistors (in the second area 406) of the semiconductor device 300 are configured as p-type in the enhancement mode, the second upper silicon layer 308B may be doped with a p-type dopant such as boron (B), aluminum (Al), indium (In), gallium (Ga), or any other suitable p-type dopant. The patterned layer 504 may then be removed after the doping process.

Figure 6:
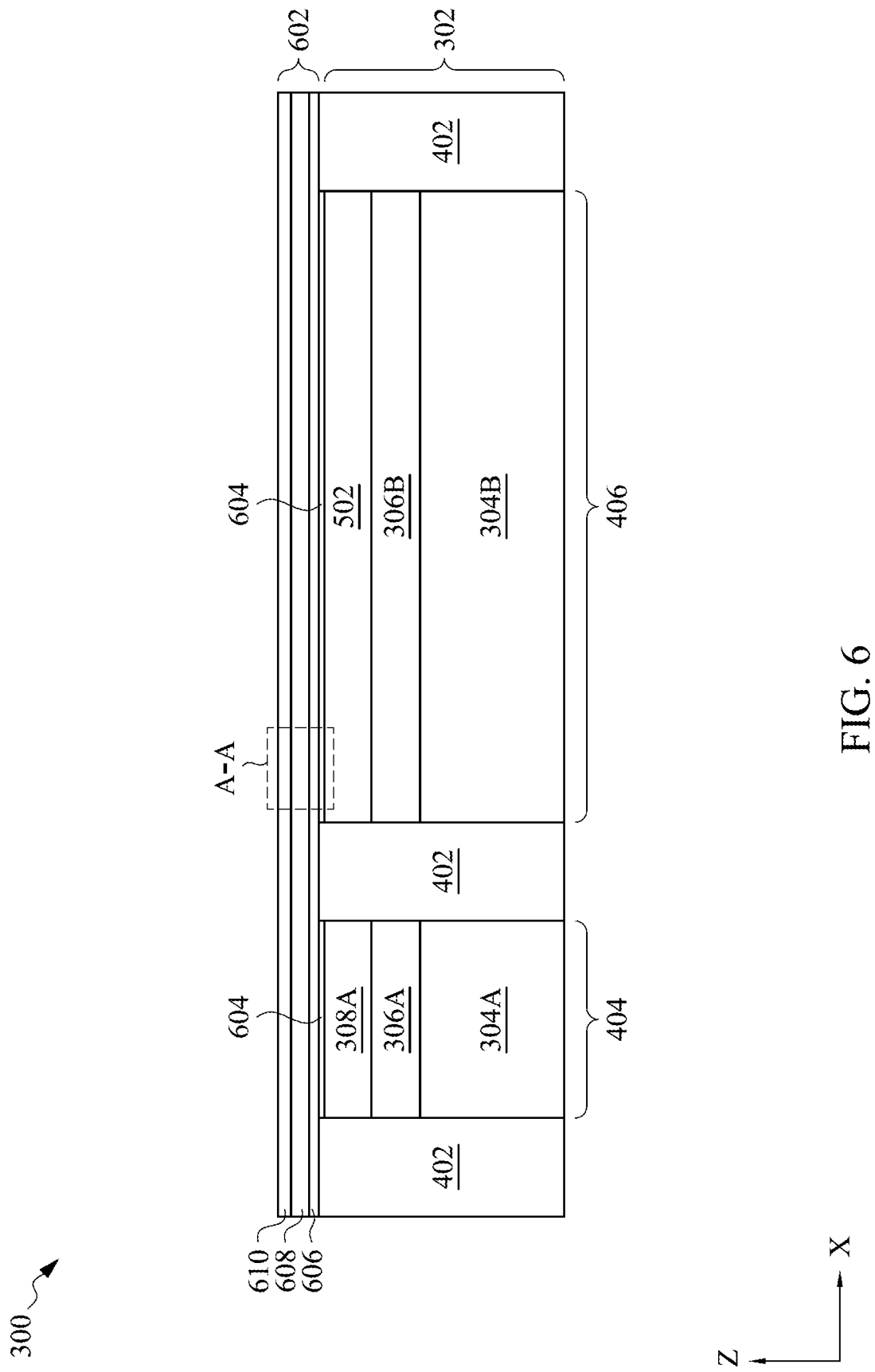
Figure 7:
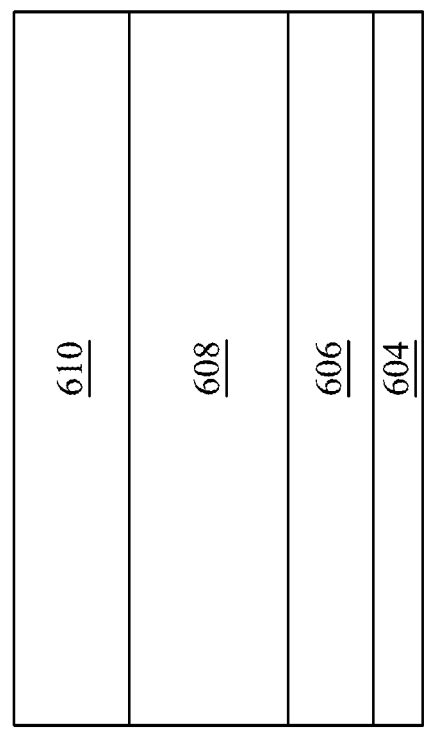

Corresponding to operation 210 of FIG. 2, FIG. 6 illustrates a cross-sectional view cut along the X-direction of the semiconductor device 300 in which poly gate structure layers 602 are formed, in accordance with various embodiments. Further, FIG. 7 illustrates an enlarged view of the poly gate structure layers 602.

As shown, the poly gate structure layers 602 are formed over the entirety of the SOI substrate 302, e.g., over the first area 404 and the second area 406. The poly gate structure layers 602 may include an oxide layer 604, a high-k dielectric layer 606, a poly gate 608 (sometimes referred to as a dummy gate), and a hard mask layer 610.

The oxide layer 604 may be a thin film comprising silicon oxide formed, for example, using a thermal oxidation process and deposited over the first upper silicon layer 308A and the first doped silicon gates 502. In some embodiments, the oxide layer 604 may not be formed over the isolation structures 402. The oxide layer 604 may act as an adhesion layer between the first upper silicon layer 308A/the first doped silicon gates 502 and the overlying high-k dielectric layer 606.

The high-k dielectric layer 606 may include a material selected from: $Al_2O_3$, HfAlO, HfAlON, AlZrO, $HfO_2$, $HfSiO_x$, $HfAlO_x$, $HfZrSiO_x$, HfSiON, $LaAlO_3$, $ZrO_2$, or combinations thereof. The high-k dielectric layer 606 may include a stack of multiple high-k dielectric layers. The high-k dielectric layer 606 may be deposited using any suitable method, including, for example molecular beam deposition (MBD), atomic layer deposition (ALD), PECVD, and the like.

The poly gate 608 may next be formed over the high-k dielectric layer 606. The poly gate may include polysilicon (polycrystalline silicon) or any suitable material more resistant to a CMP process. Polysilicon is tolerant of manufacturing steps which involve extremely high temperatures (in excess of 900° C.) where metal is not. The poly gate may be deposited using any suitable method including, for example molecular beam deposition (MBD), atomic layer deposition (ALD), PECVD, and the like.

The hard mask layer 610 may next be formed over the poly gate 608. In one embodiment, each of the one or more layers of the hard mask layer 610 may be formed of a dielectric material (other than a polymer or other organic "soft" resist material) such as, for example, silicon nitride, silicon carbide, or the like.

Figure 8:
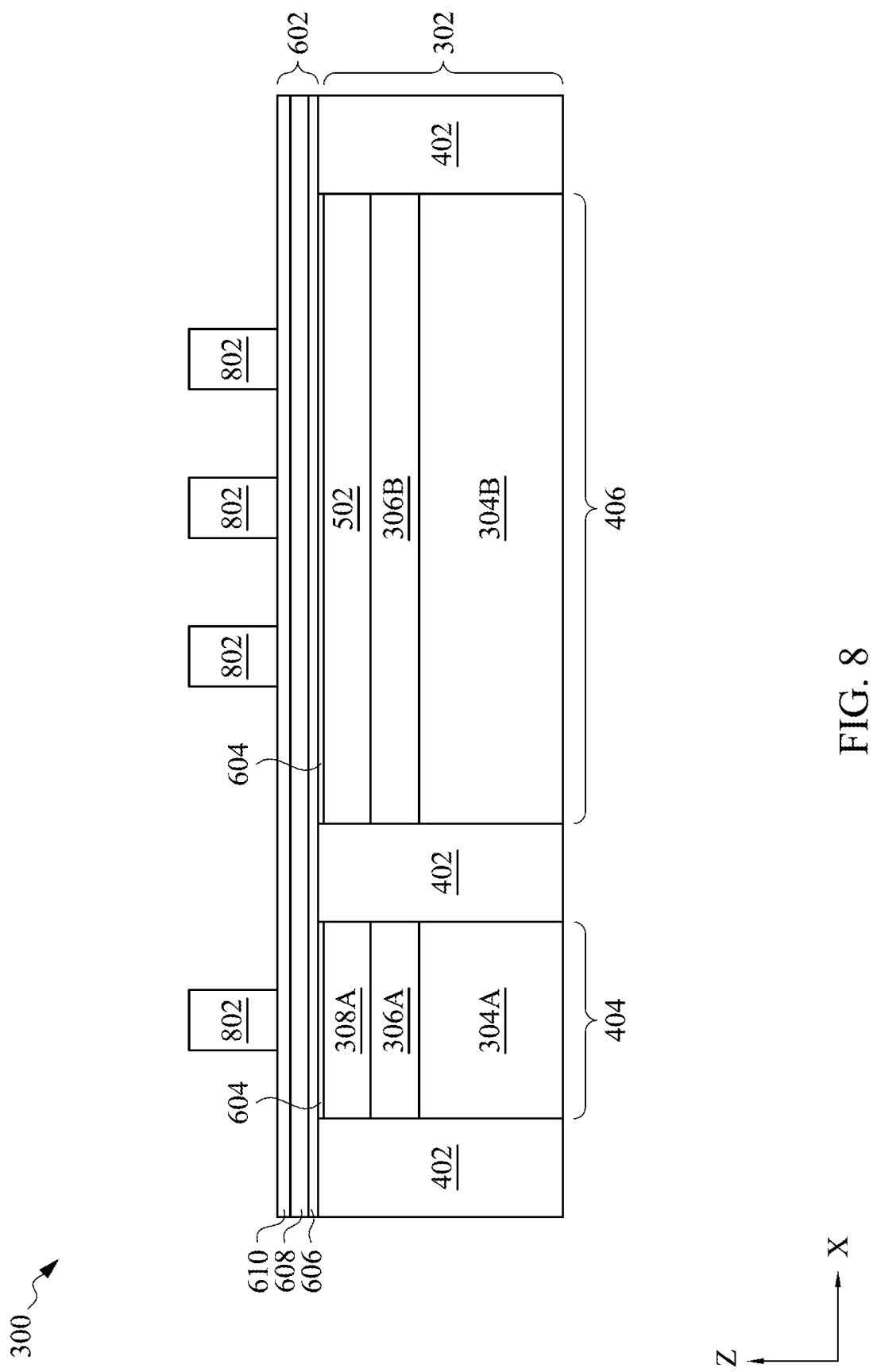

Also corresponding to operation 210 of FIG. 2, FIG. 8 illustrates a cross-sectional view cut along the X-direction of the semiconductor device 300 in which a plurality of patterned layers (e.g., photoresist layers) 802 are formed over the poly gate structure layers 602, in accordance with various embodiments.

In some embodiments, the patterned layers 802 are formed to pattern respective poly gate structure layers 602 (e.g., poly gate 608) in the first area 404 and the second area 406. Such patterned poly gates can later be used to define the footprints of metal gates in the first area 404 and the second area 406, respectively. For example in FIG. 8, one of the patterned layers 802 is deposited in the first area 404 and multiple ones of the patterned layers 802 are deposited in the second area 406. It is understood that although three patterned layers 802 are deposited in the second area 406, the number of patterned layers 802 is not limited to three and can be any suitable number (e.g., 2, 4, 5, 6, etc.). The number of patterned layers 802 in the second area 406 may correspond to the desired number of metal gates.

Figure 9:
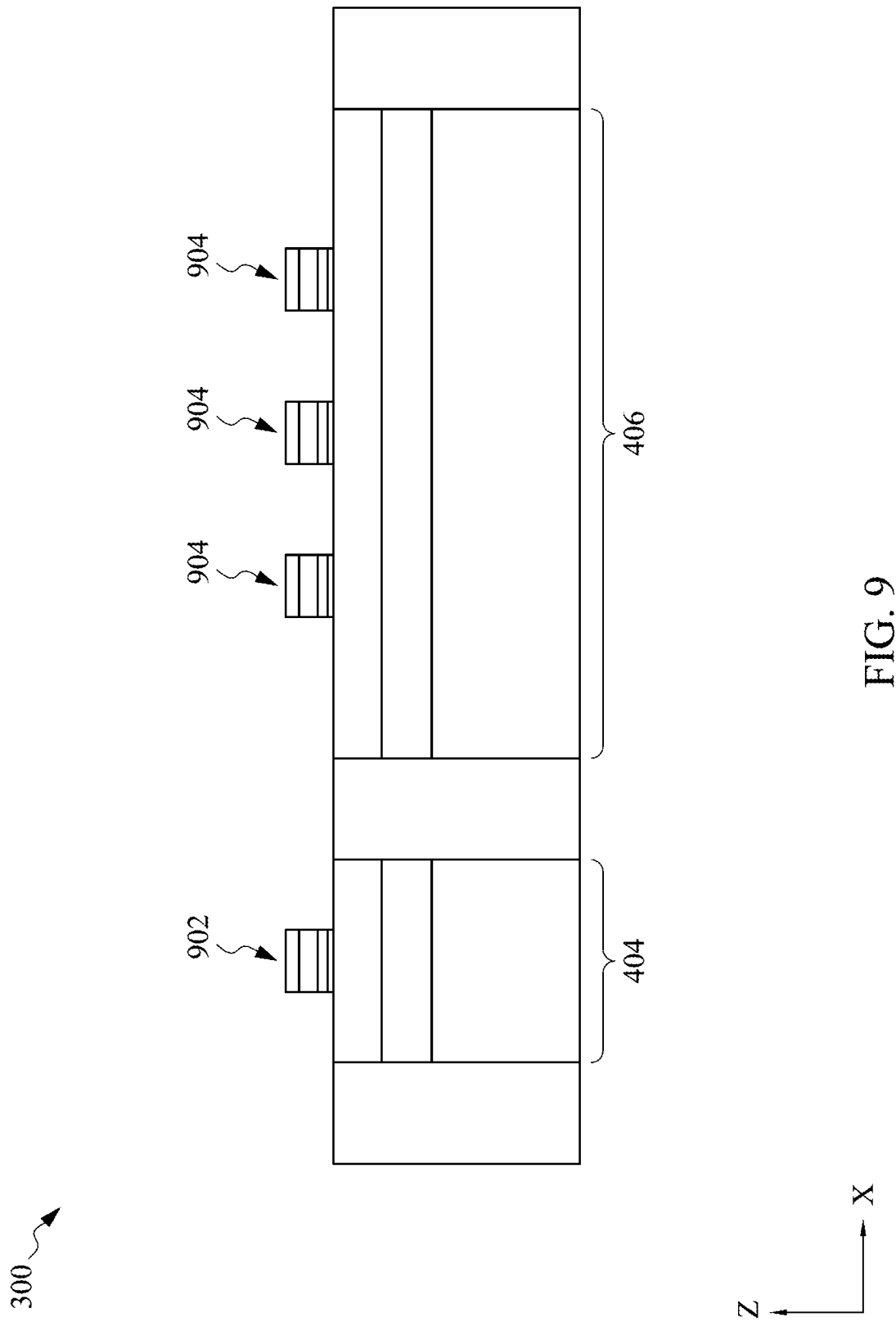

Also corresponding to operation 210 of FIG. 2, FIG. 9 illustrates a cross-sectional view cut along the X-direction of the semiconductor device 300 in which a first poly gate structure (sometimes referred to as a dummy gate structure) 902 is formed in the first area 404 and a plurality of second poly gate structures 904 (sometimes referred to as dummy gate structures) are formed in the second area 406, in accordance with some embodiments.

After the patterned layers 802 are formed, the poly gate structure layers 602 (including the oxide layer 604, the high-k dielectric layer 606, the poly gate 608, and the hard mask layer 610) may be patterned to form the poly gate structure 902 in the first area 402 and the poly gate structures 904 in the second area 406, respectively. The poly gate structures 902 and 904 each include (remaining or patterned portions of) the oxide layer 604, the high-k dielectric layer 606, and the poly gate 608. The hard mask layer 610 may remain on top of the poly gate structures 902 and 904, which can avoid the poly gate 608 from being silicided (as will be discussed below). The poly gate structures 902 and 904 and the hard mask layer 610 may be patterned using photolithography techniques. For example, with the patterned layers 802 serving as an etching mask, the first poly gate structure 902 and the second poly gate structures 904 are formed by removing unmasked portions of the poly gate structure layers 602 through an etching technique, such as reactive ion etch (ME), neutral beam etch (NBE), any other suitable process, or combinations thereof. The etch may be anisotropic.

Figure 10:
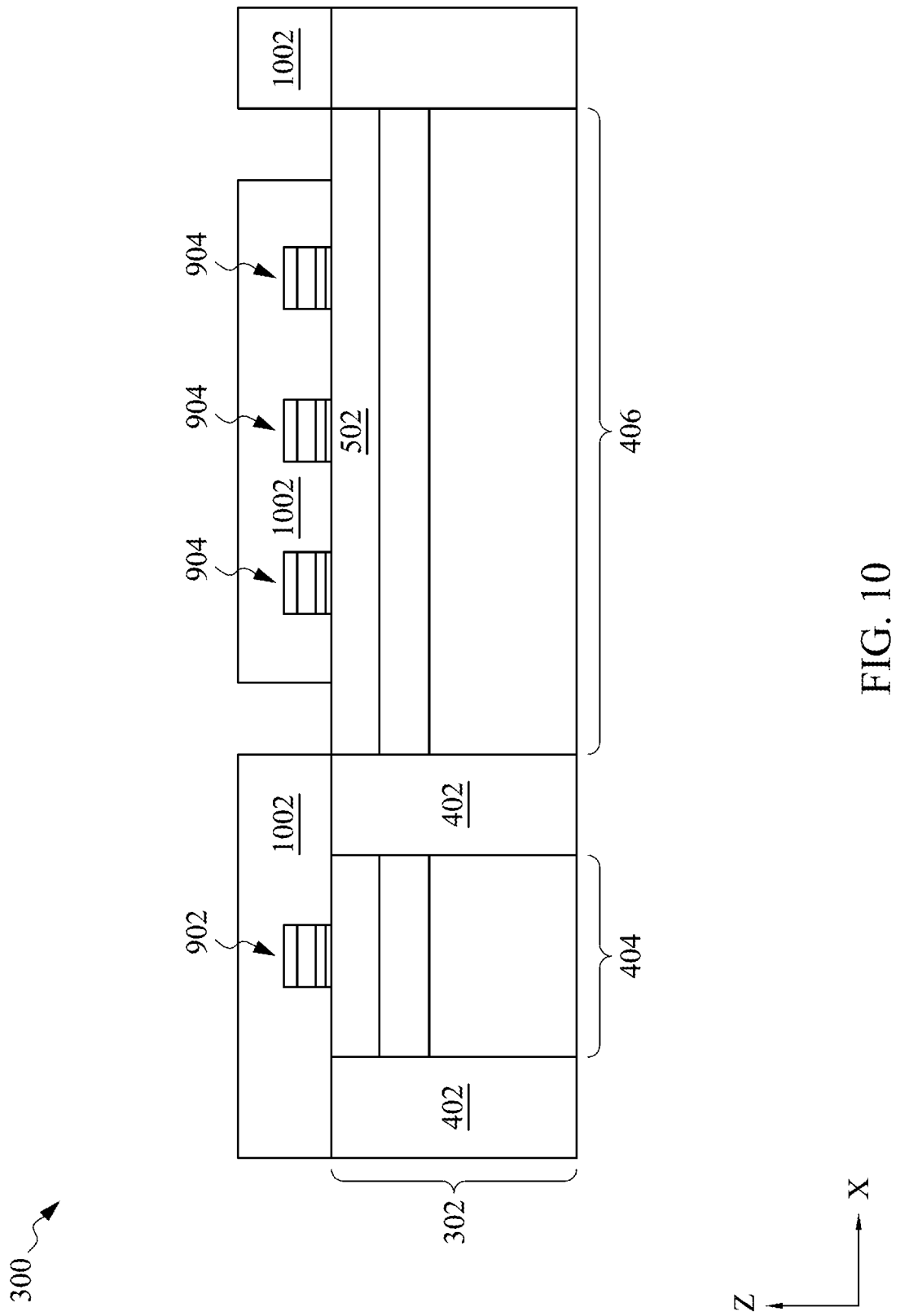

Corresponding to operation 212 of FIG. 2, FIG. 10 illustrates a cross-sectional view cut along the X-direction of the semiconductor device 300 in which a plurality of patterned layers (e.g., photoresist layers) 1002 are formed over the first area 404 and the second area 406, respectively, in accordance with some embodiments.

In some embodiments, the patterned layers 1002 are formed to define the footprints of source region and drain region of a transistor in the second area 406. For example in FIG. 10, the patterned layers 1002 may be formed over the entirety of the first area 404, top surfaces of the isolation structures 402, and portions of the second area 406. As such, the patterned layers 1002 may expose end portions of the first doped silicon gate 502 in the second area 406.

Figure 11:
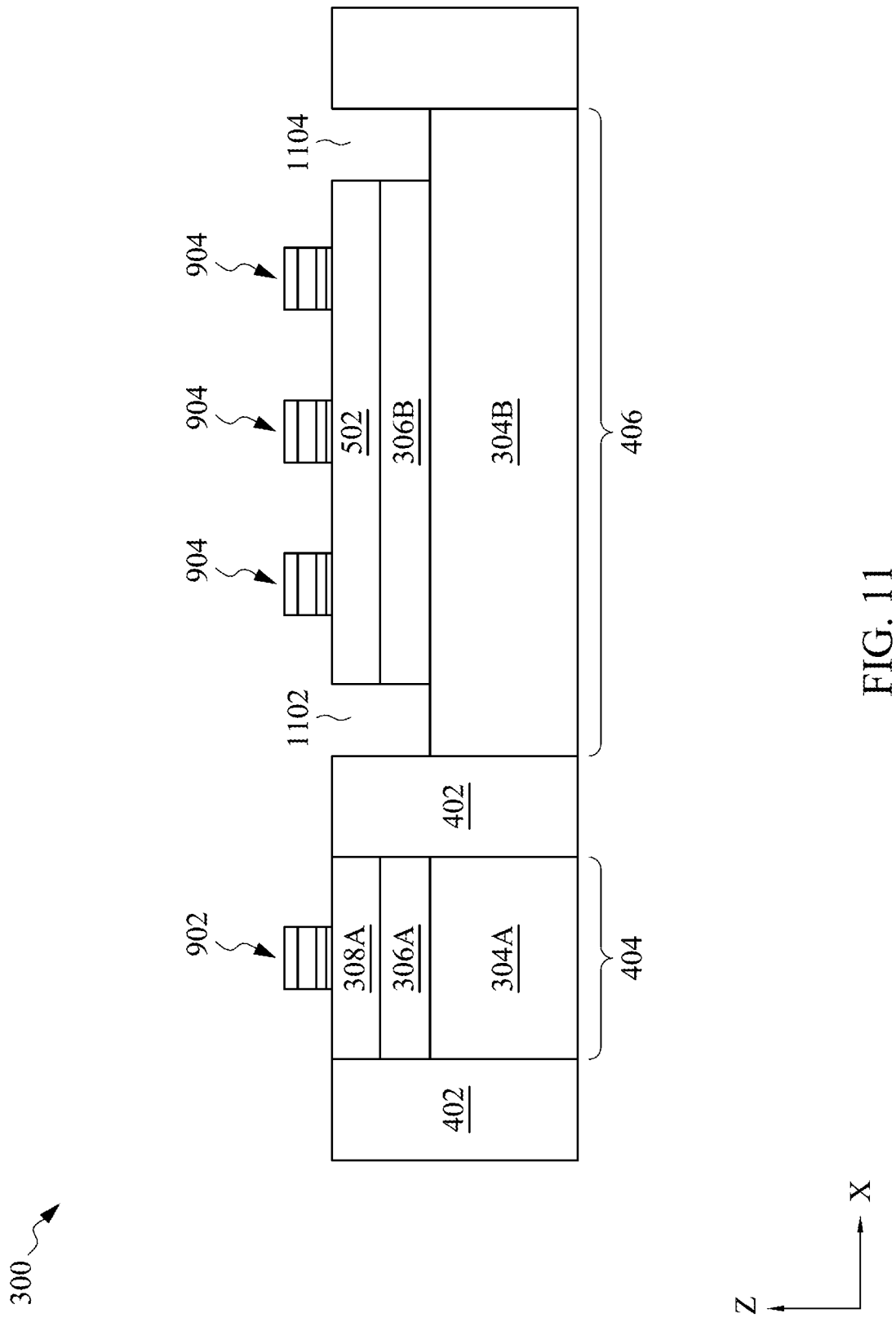

Also corresponding to operation 212 of FIG. 2, FIG. 11 illustrates a cross-sectional view cut along the X-direction of the semiconductor device 300 in which end portions of the first doped silicon gate 502 and end portions of the second silicon oxide layer 306B are recessed, in accordance with some embodiments.

After the patterned layers 1002 are formed, the first doped silicon gate 502 and the second silicon oxide layer 306B are patterned, thereby forming recesses 1102 and 1104, as shown in FIG. 11. The end portions of the first doped silicon gate 502 and the second silicon oxide layer 306B may be recessed using photolithography techniques. Any suitable method such as a reactive ion etch (ME), neutral beam etch (NBE), the like, any other suitable process, or combinations thereof may be used. The etch may be anisotropic.

Figure 12:
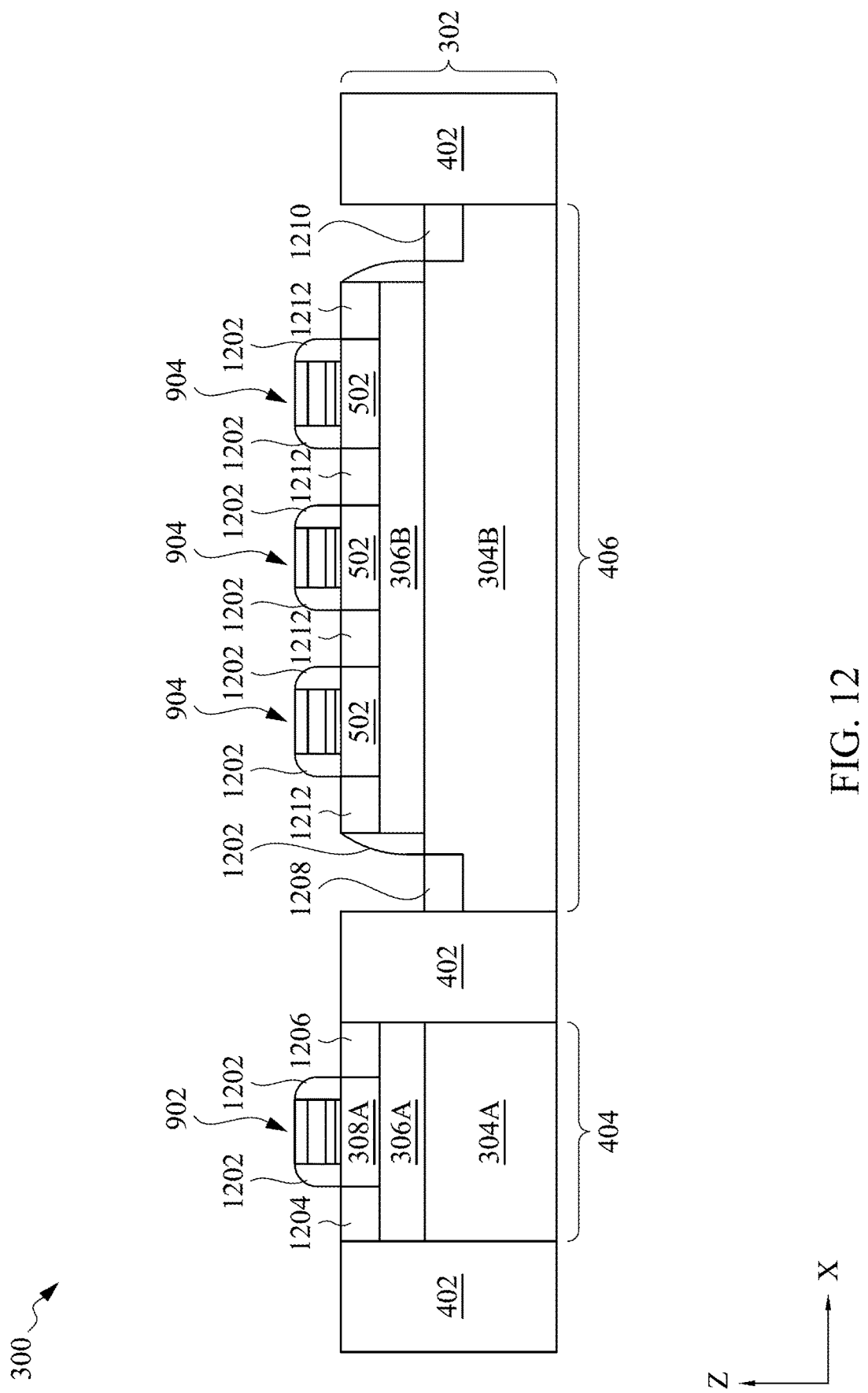

Corresponding to operations 214 and 216 of FIG. 2, FIG. 12 illustrates a cross-sectional view cut along the X-direction of the semiconductor device 300 in which gate spacers 1202, source regions 1204 and 1208, drain regions 1206 and 1210, and second doped silicon gates 1212 are formed, in accordance with some embodiments.

At operation 214, a plurality of gate spacers 1202 may be formed around sidewalls of each of the poly gate structures 902 and 904, sidewalls of the "recessed" first silicon doped gate 502, and sidewalls of the recessed second silicon oxide layer 306B, as shown in FIG. 12. As will be shown below, the gate spacers 1201 may each be formed to laterally surround either a poly gate structure or a doped silicon gate. The gate spacers 1202 may be formed from a dielectric material such as, but not limited to, silicon oxide, silicon nitride, multilayers thereof, or the like. Any suitable deposition method, such as thermal oxidation, chemical vapor deposition (CVD), or the like, may be used to form the dielectric material. Next, one or more photolithography processes and one or more etching processes are performed on the dielectric layer to form the gate spacers 1202.

At operation 216, exposed portions of the silicon layers in both the first area 404 and the second area 406 may be doped. In the first area 404, the portions of the first upper silicon layer 308A that are not overlaid by the first poly gate structure 902 or its gate spacer 1201 are doped to form a first source region 1204 and a first drain region 1206. The first source region 1204 and the first drain region 1206 are laterally disposed on opposite sides of the first poly gate structure 902. When the transistor in the first area 404 is configured as n-type, the first source region 1204 and the first drain region 1206 may be doped with an n-type dopant such as phosphorus (P), arsenic (As), antimony (Sb), or any other suitable n-type dopant. When the transistor in the first area 404 is configured as p-type, the first source region 1204 and the first drain region 1206 may be doped with a p-type dopant such as boron (B), aluminum (Al), indium (In), gallium (Ga), or any other suitable p-type dopant. The first source region 1204 and the first drain region 1206 may be doped in a third concentration. The third concentration may be greater than the first concentration of the doping of the silicon layers of the SOI substrate 302 (as discussed with respect to FIG. 4). The third concentration may be less than the second concentration of the doping of the second upper silicon layer 308B, now the first doped silicon gate 502, (as discussed with respect to FIG. 5).

In the second area 406, exposed portions of the second lower silicon layer 304B may also be doped with the same third concentration to form the second source region 1208 and the second drain region 1210. The second source region 1208 and the second drain region 1210 are laterally disposed on opposite sides of the first doped silicon layer 502 or the second silicon oxide layer 306B (FIG. 11). Similarly, when the transistor in the second area 406 is configured as n-type, the second source region 1208 and the second drain region 1210 may be doped with an n-type dopant such as phosphorus (P), arsenic (As), antimony (Sb), or any other suitable n-type dopant. When the transistor in the second area 406 is configured as p-type, the second source region 1208 and the second drain region 1210 may be doped with a p-type dopant such as boron (B), aluminum (Al), indium (In), gallium (Ga), or any other suitable p-type dopant.

In the second area 406, exposed portions of the first doped silicon gate 502 (FIG. 11) may also be doped with the same third concentration to form a second doped silicon gate 1212. Specifically, the portions of the first doped silicon gate 502 that are not overlaid by the second poly gate structures 904 or their gate spacers 1202 are doped to form the second doped silicon gate 1212. In various embodiments, the second doped silicon gate 1212 can thus be formed as a continuous structure surrounding a number of discretely or separately arranged portions of the first doped silicon gate 502 that are "unexposed" by the poly gate structures 904 (or their respective gate spacers 1201). As such, the second doped silicon gate 1212 can include a number of portions, two laterally adjacent ones of which are disposed on opposite sides of a corresponding one of the second poly gate structures 904, or a corresponding one of the discretely arranged portions of the first doped silicon gate 502. Hereinafter, the discretely arranged portions of the first doped silicon gate 502 are sometimes referred to as "first doped silicon gates 502," and the portions of the second doped silicon gate 1212 that are disposed on the sides of a corresponding one of the first doped silicon gates 502 are sometimes referred to as "second doped silicon gates 1212." Following such a definition, the second doped silicon gates 1212 are arranged alternately with the first doped silicon gates 502, as shown in the cross-sectional view of FIG. 12 (and the following cross-sectional views cut in the same direction).

Similarly, when the transistor in the second area 406 is configured as n-type, the second doped silicon gates 1212 may be doped with an n-type dopant such as phosphorus (P), arsenic (As), antimony (Sb), or any other suitable n-type dopant. When the transistor in the second area 406 is configured as p-type, the second doped silicon gates 1212 may be doped with a p-type dopant such as boron (B), aluminum (Al), indium (In), gallium (Ga), or any other suitable p-type dopant.

Figure 13:
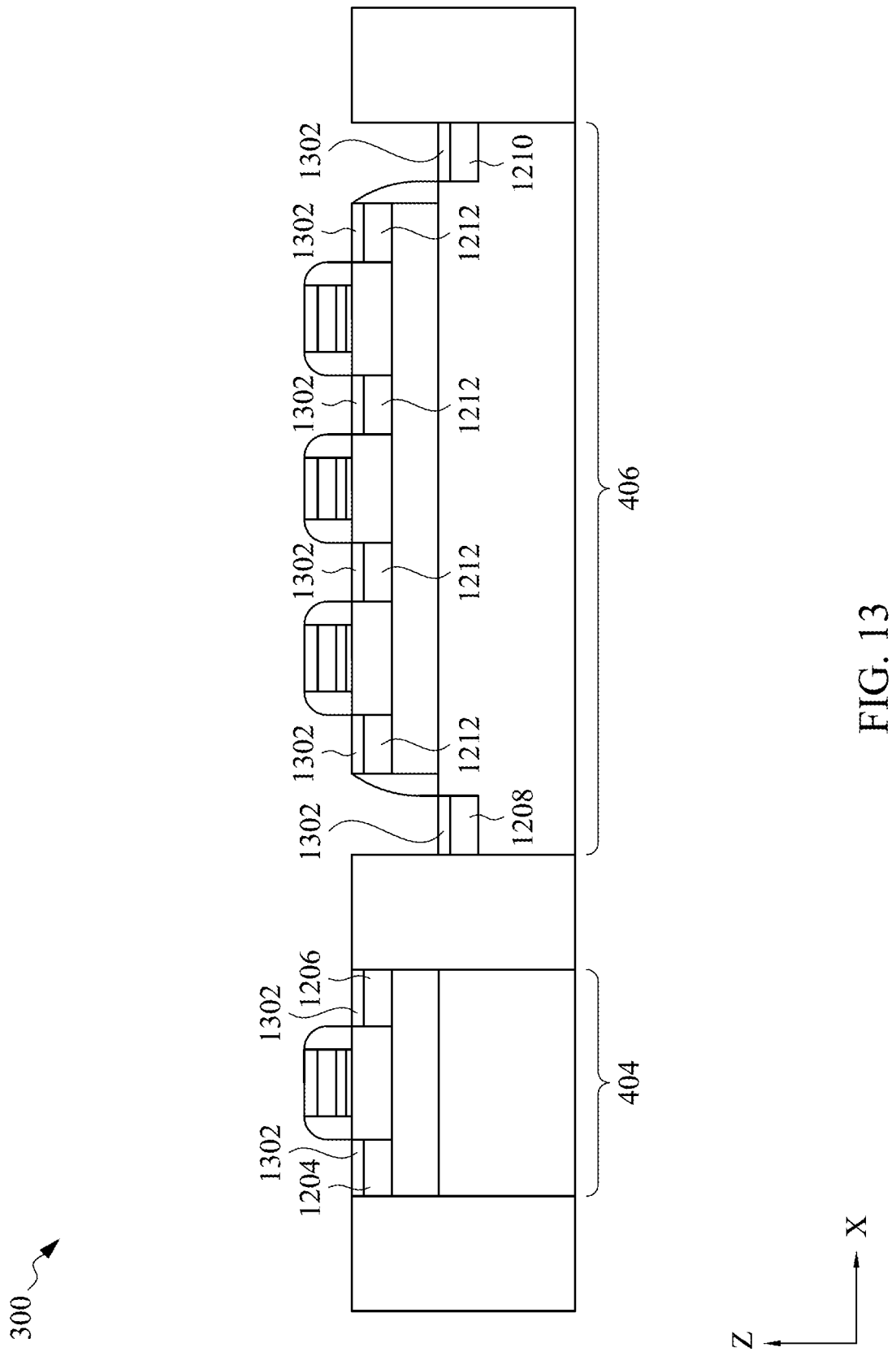

Corresponding to operation 218 in FIG. 2, FIG. 13 illustrates a cross-sectional view cut along the X-direction of the semiconductor device 300 in which a plurality of silicide layers 1302 are formed on the first source region 1204, the first drain region 1206, the second source region 1208, the second drain region 1210, and the second doped silicon gates 1212, respectively, in accordance with some embodiments.

The plurality of silicide layers 1302 may each be formed on the exposed surface of a silicon layer, such as the first source region 1204, the first drain region 1206, the second source region 1208, the second drain region 1210, and the second doped silicon gates 1212. The silicide layers 1302 may be formed in both the first area 404 and the second area 406 to reduce the contact resistance of the silicon layers with any structures formed in contact with the silicon layers. The silicide layers 1302 may include a mixture of metal and semiconductor materials such as platinum silicides, titanium silicides, cobalt silicides, nickel silicides, tungsten silicides, molybdenum silicides, tantalum silicides, other metallic silicides, germanides, polycides, salicides, combinations thereof, multi-layers thereof, alloys thereof, or the like. The silicide layers 1302 may be formed from sputtering a metal film on a silicon wafer surface using a method such as but not limited to PVD, heating the silicon wafer in order to react the silicon and the metal to form a metallic silicide, and removing the metal film. In some embodiments, the silicide layers 1302 can be optional.

Figure 14:
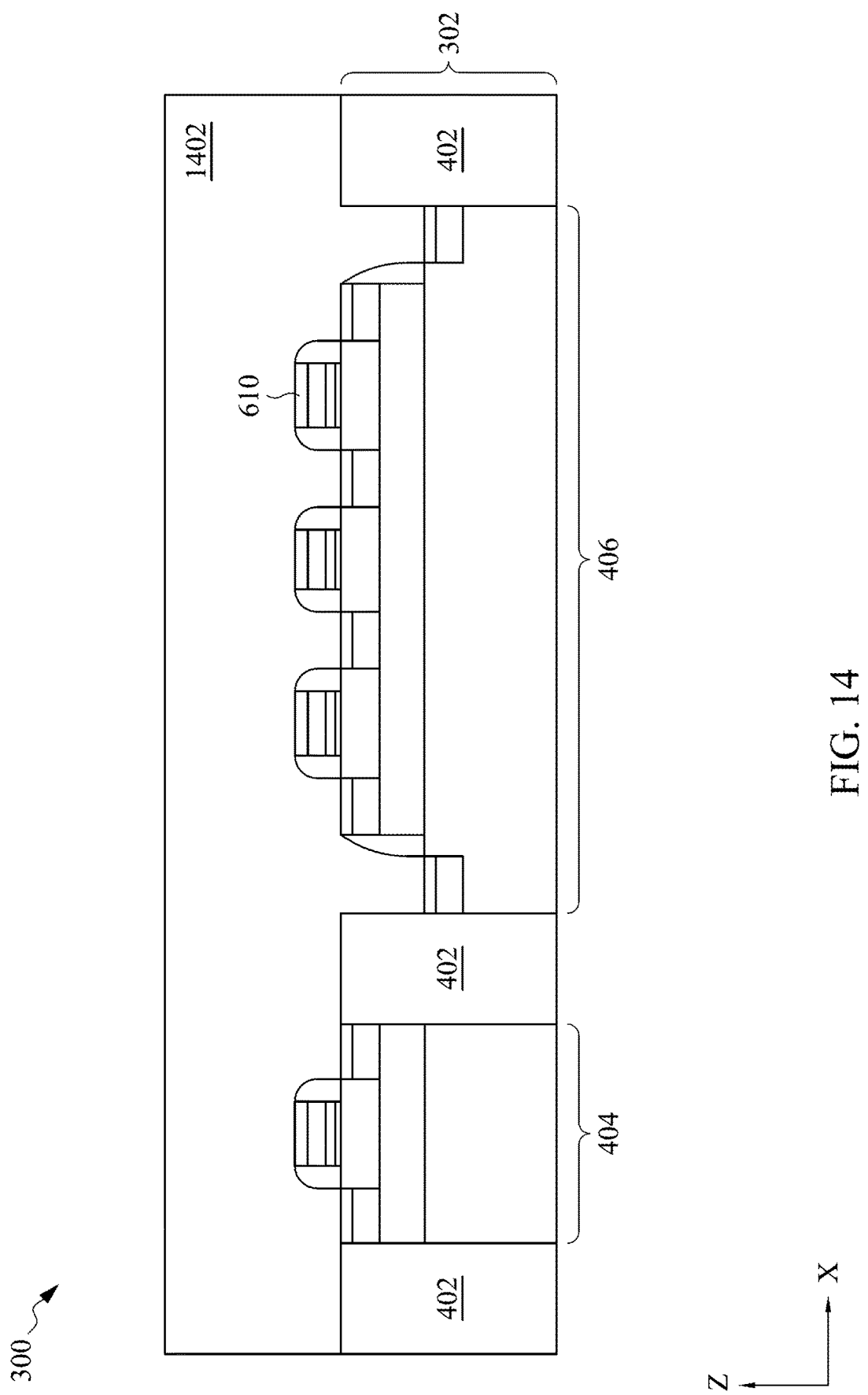

Corresponding to operation 220 of FIG. 2, FIG. 14 illustrates a cross-sectional view cut along the X-direction of the semiconductor device 300 in which a first interlayer dielectric (ILD) 1402 is formed over the first area 404, the second area 406, and the isolation structures 402, in accordance with some embodiments.

In some embodiments, the first ILD 1402 is formed of a dielectric material such as silicon oxide, phosphosilicate glass (PSG), borosilicate glass (BSG), boron-doped phosphosilicate glass (BPSG), undoped silicate glass (USG), or the like, and may be deposited by any suitable method, such as CVD, PECVD, or FCVD. The first ILD 1402 may be formed over the entirety of the semiconductor device 300, including the isolation structures 402, the first area 404, and the second area 406. The first ILD 1402 may extend in both the X-direction and the Y-direction continuously.

Figure 15:
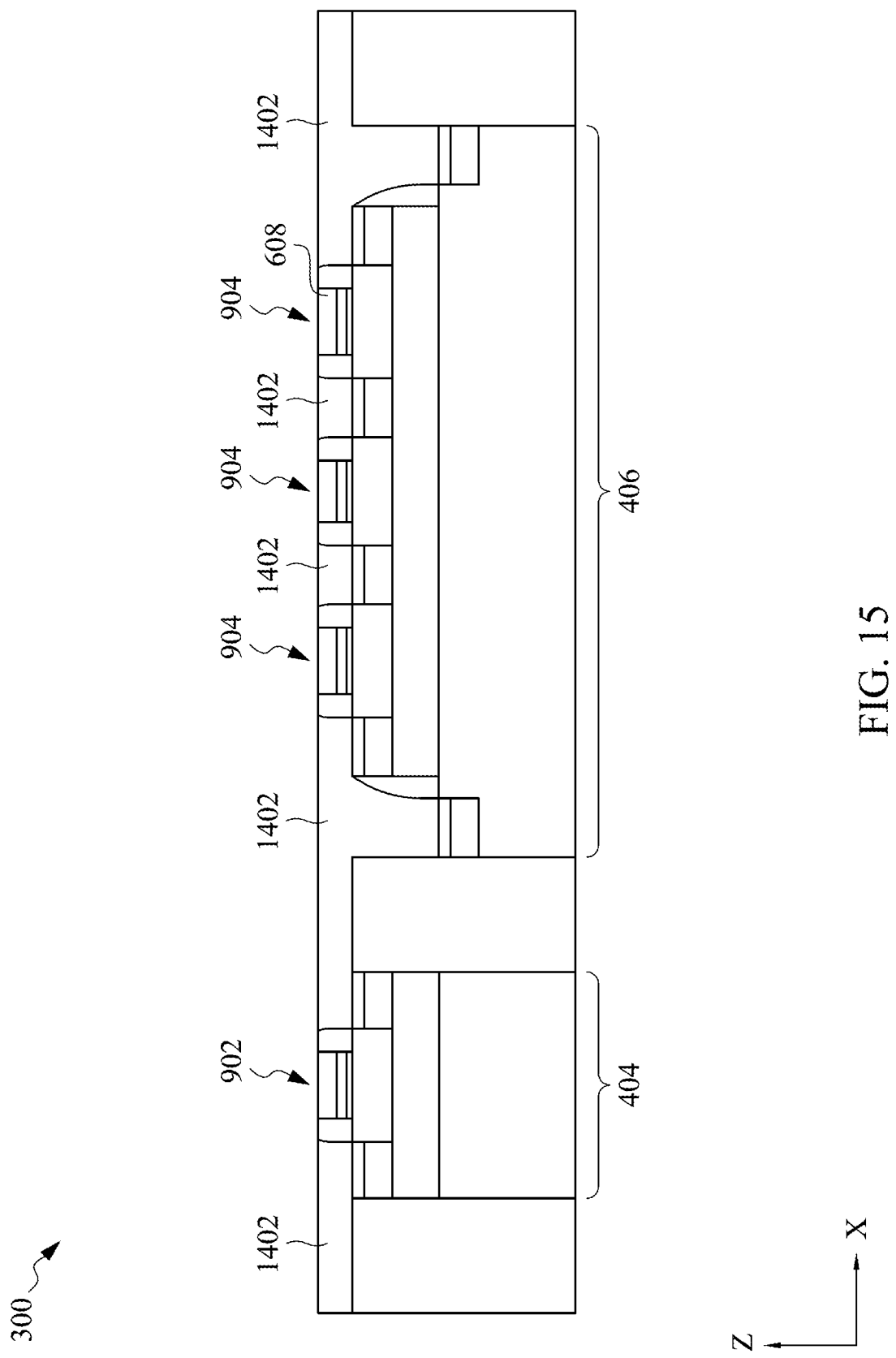

Corresponding to operation 222 of FIG. 2, FIG. 15 illustrates a cross-sectional view cut along the X-direction of the semiconductor device 300 in which a polishing (e.g., Chemical Mechanical Polishing (CMP)) process is applied to the first ILD 1402, in accordance with some embodiments.

After the first ILD 1402 is formed, a planarization or polishing process, such as a CMP process, may be performed to achieve a level upper surface for the first ILD 1402. The CMP process may also remove the hard mask layer 610 disposed as a top layer on the poly gate structures 902 and 904. The CMP process may be performed to expose a top surface of the first poly gate structure 902 in the first area 404 and top surfaces of the second poly gate structures 904 in the second area 406. According to various embodiments, the plurality of second poly gate structures 904 in the second area 406 can help prevent a dishing effect from being incurred during the CMP process. For example, with the second poly gate structures 904 laterally spaced from one another, the second poly gate structures 904 can serve as a number of discrete pillars to fight against a downwardly applied force of the CMP process that tends to form a dishing profile at the center of a continuously formed material.

Figure 16:
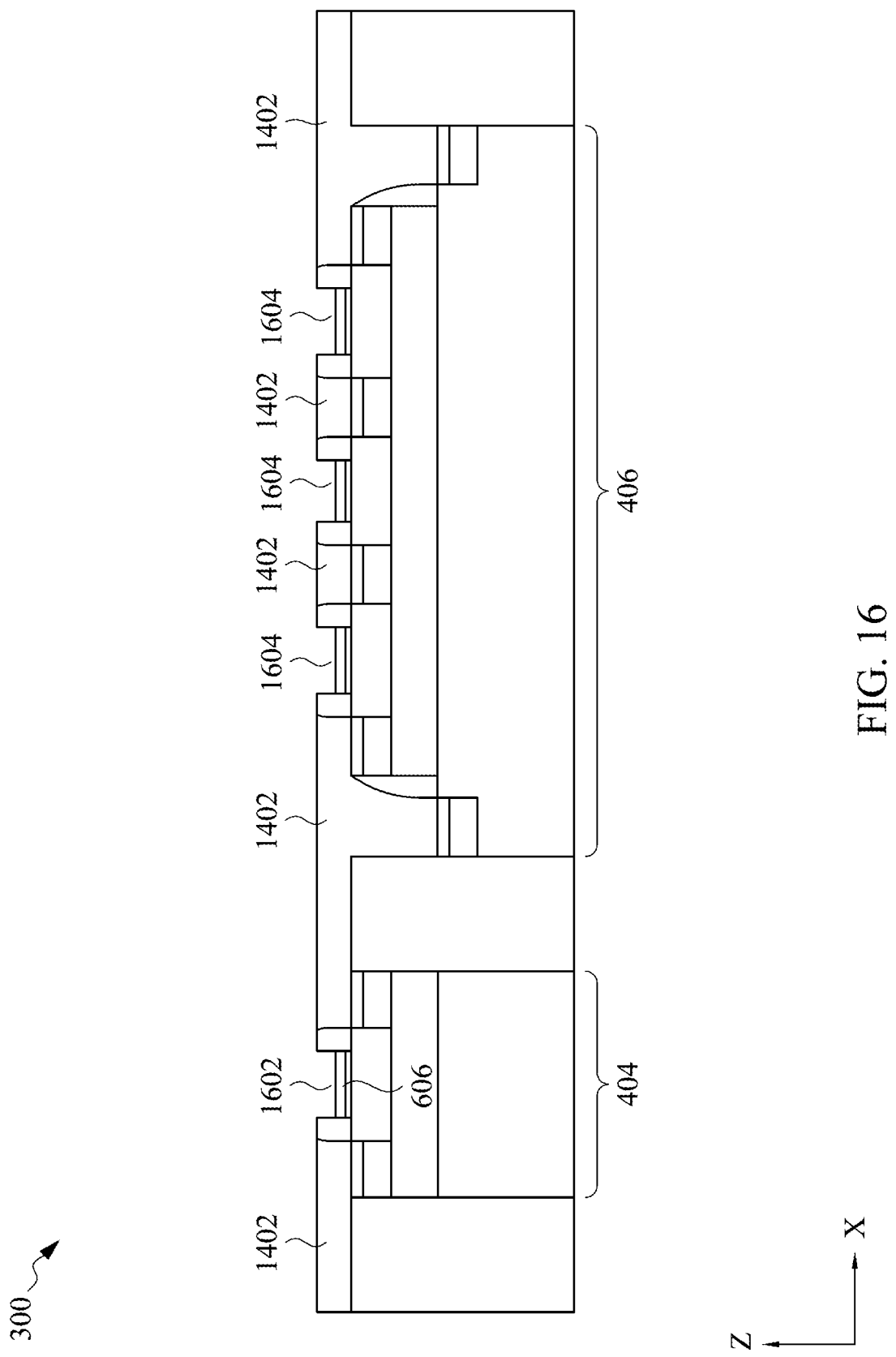

Corresponding to operation 224 of FIG. 2, FIG. 16 illustrates a cross-sectional view cut along the X-direction of the semiconductor device 300 in which the poly gates 608 are removed, in accordance with some embodiments.

The poly gates 608 may be removed, exposing the top surfaces of the high-k dielectric layers 606, by any suitable etching process. The etch may be anisotropic. A first recess 1602 may be formed by the removal of the poly gates 608 in the first area 404. A plurality of second recesses 1604 may be formed by the removal of the poly gates 608 in the second area 406.

Figure 17:
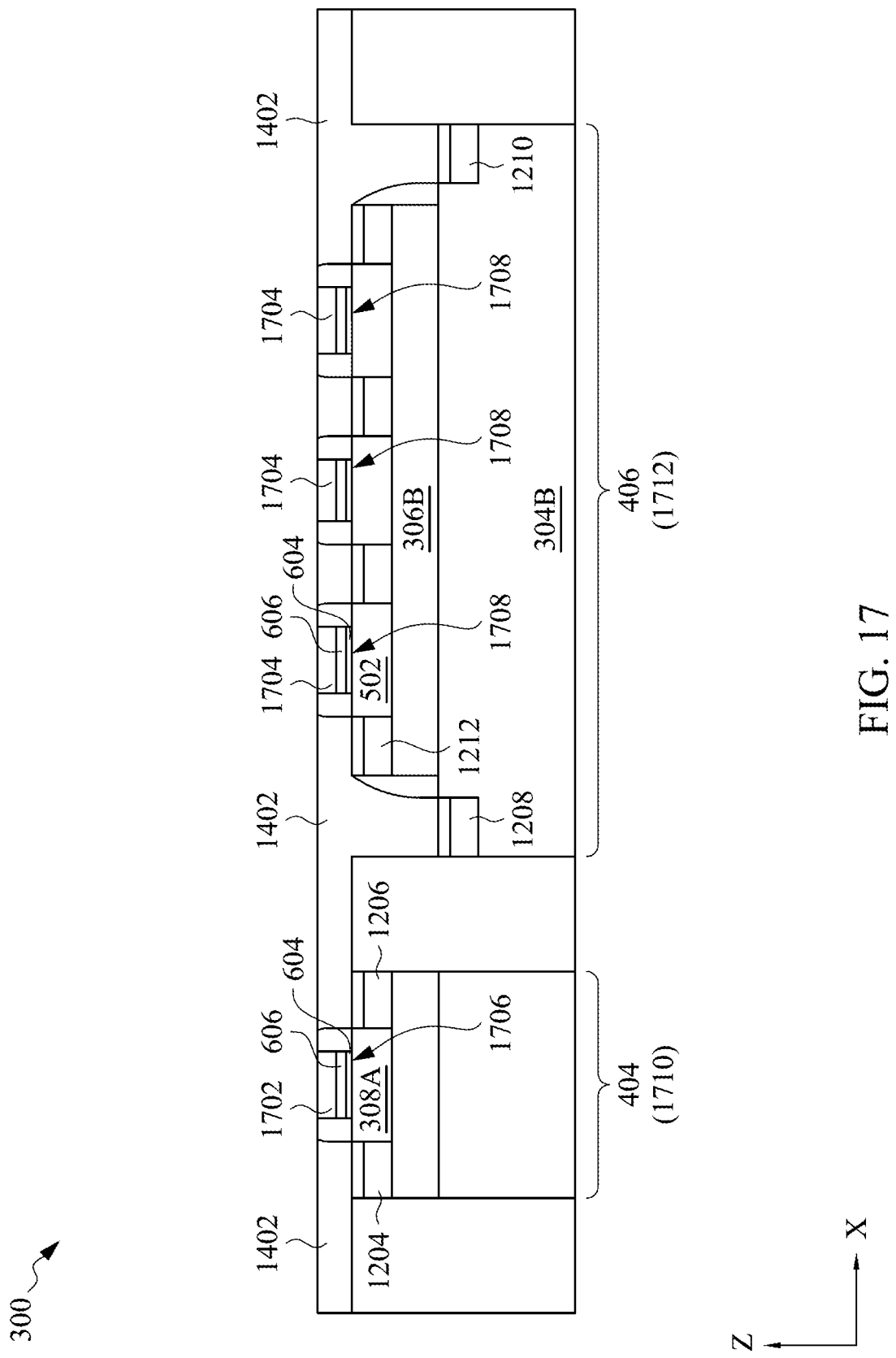

Corresponding to operation 226 of FIG. 2, FIG. 17 illustrates a cross-sectional view cut along the X-direction of the semiconductor device 300 in which a first metal gate 1702 and a plurality of second metal gates 1704 are formed in the first recess 1602 and the plurality of second recesses 1604, respectively, in accordance with some embodiments.

In some embodiments, a first metal gate 1702 is formed in the first recess 1602 in the first area 404 on the top surface of the high-k dielectric layer 606. In some embodiments, multiple second metal gates 1704 are formed in the second recesses 1604 in the second area 406 on the top surfaces of the high-k dielectric layer 606. It is understood that although three second metal gates 1704 are shown, the number of second metal gates 1704 can be any suitable number (e.g., 2, 4, 5, 6, 7, etc.).

In some embodiments, the first metal gate 1702 and the second metal gates 1704 may each include a p-type work function layer, an n-type work function layer, multi-layers thereof, or combinations thereof. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. The work function layer(s) may be deposited by CVD, physical vapor deposition (PVD), ALD, and/or other suitable process. After depositing the one or more work function layers, a planarization process such as a CMP process may be performed to remove the excess metal.

A first metal gate structure 1706 may include the first metal gate 1702, the high-k dielectric layer 606, and the oxide layer 604. Each of the plurality of second metal gate structures 1708 may include the second metal gate 1704, the high-k dielectric layer 606, and the oxide layer 604. The plurality of second metal gate structures 1708 may be disposed directly above the plurality of first doped silicon gates 502, in some embodiments. The first metal gate structure 1706 may be laterally coplanar with the plurality of second metal gate structures 1708.

After the formation of the metal gates, a first transistor 1710 and a second transistor 1712 may be defined in the first area 404 and the second area 406, respectively. The first transistor 1710 and the second transistor 1712 may be any suitable transistor such as, but not limited to, a field-effect transistor (FET). The first transistor 1710 may be constituted at least by the first upper silicon layer 308A, the oxide layer 604, the high-k dielectric layer 606, the first metal gate structure 1706, the first source region 1204, and the first drain region 1206. The first transistor 1710 may be an n-type transistor or a p-type transistor, as discussed above. Further, the first upper silicon layer 308A can serve as a channel of the first transistor 1710; the first meal gate structure 1706 may serve as a gate (terminal) of the first transistor 1710; the oxide layer 604 and the high-k dielectric layer 606 may collectively serve as a gate dielectric layer of the first transistor 1710; and the first source region 1204 and first drain region 1206 may serve as a drain (terminal) and source (terminal) of the first transistor 1710, respectively.

The second transistor 1712 may be constituted at least by the second lower silicon layer 304B, the second silicon oxide layer 306B, the plurality of first doped silicon gates 502, the plurality of second doped silicon gates 1212, the second source region 1208, and the second drain region 1210. The second transistor 1712 may be an n-type transistor or a p-type transistor. Further, the second lower silicon layer 304B can serve as a channel of the second transistor 1712; the first doped silicon gates 502 and the second doped silicon gates 1212 may collectively serve as a gate (terminal) of the second transistor 1712; the second silicon oxide layer 306B may serve as a gate dielectric layer of the second transistor 1712; and the second source region 1208 and second drain region 1210 may serve as a drain (terminal) and source (terminal) of the second transistor 1712, respectively.

In accordance with various embodiments, the first metal gate structure 1706 has a first length (e.g., along the X-direction) and a first width (e.g., along the Y-direction). The plurality of first doped silicon gates 502 and the plurality of second doped silicon gates 1212 collectively have a second length (e.g., along the X-direction) and a second width (e.g., along the Y-direction). The first length may be substantially shorter than the second length, and the first width may be substantially narrower than the second width. Additionally, a thickness of the oxide layer 604 and the high-k dielectric layer 606 combined may be substantially thinner than a thickness of the second silicon oxide layer 306B. With such configurations, the first transistor 1710 is operated under a first voltage, and the second transistor 1712 is operated under a second voltage, where the second voltage can be substantially higher than the first voltage.

Figure 18:
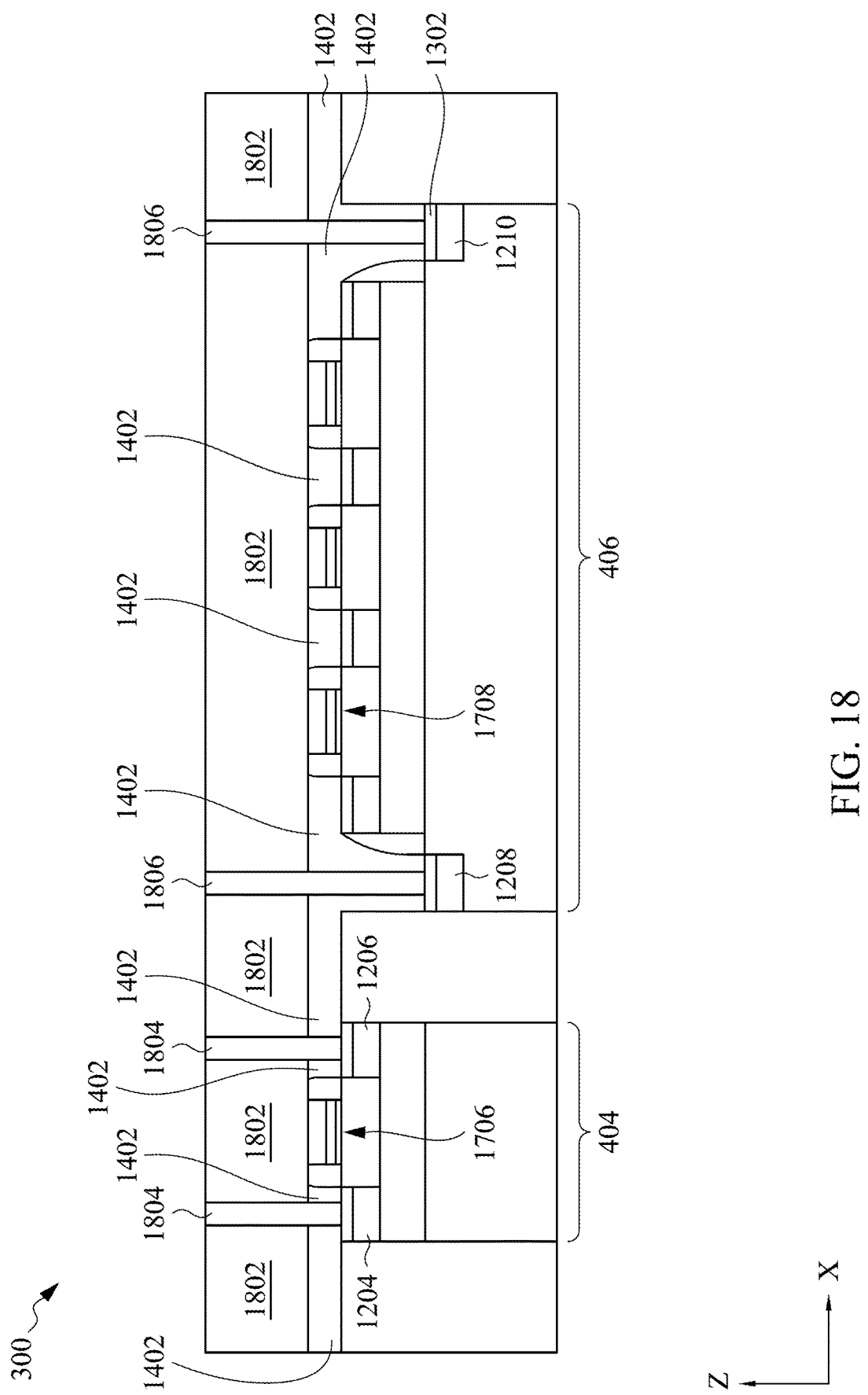

Corresponding to operations 228 and 230 of FIG. 2, FIG. 18 is a cross-sectional view cut along the X-direction of the semiconductor device 300 in which a second ILD 1802, a plurality of first bottom vias 1804, and a plurality of second bottom vias 1806 are formed, in accordance with some embodiments.

At operation 228, the second ILD 1802 may be formed over the first metal gate structure 1706, the plurality of second metal gate structures 1708, and the first ILD 1402. The second ILD may be substantially similar to the first ILD 1402 and is formed of a dielectric material such as silicon oxide, phosphosilicate glass (PSG), borosilicate glass (BSG), boron-doped phosphosilicate glass (BPSG), undoped silicate glass (USG), or the like, and may be deposited by any suitable method, such as CVD, PECVD, or FCVD. The second ILD 1802 may be formed over the entirety of the semiconductor device 300. The second ILD 1802 may extend in both the X-direction and the Y-direction continuously. After the second ILD 1802 is formed, a planarization process, such as a CMP process, may be performed to achieve a level upper surface for the second ILD 1802.

At operation 230, the plurality of first bottom vias 1804 and the plurality of second bottom vias 1806 may be formed.

The first bottom vias 1804 and the second bottom vias 1806 extend vertically in the Z-direction and electrically couple to either a source region or a drain region. In some embodiments, the silicide layer 1302 is disposed between the bottom vias and the source region or drain region. In such embodiments, the silicide layer 1302 may be configured to reduce the contact resistance between the bottom vias and the source region or the drain region. The first bottom vias 1804 and the second bottom vias 1806 may be formed through a dual-damascene or single-damascene process by forming one or more vertical trenches extending through the first ILD 1402 and the second ILD 1802 and configured to expose a top surface of a source region or a drain region. These trenches may then be filled with a metallic fill material. The metallic fill material includes at least one metal material selected from the group consisting of tungsten, copper, cobalt, ruthenium, titanium, tantalum, or combinations thereof. The metallic fill material can be deposited by a conformal deposition method, which can be, for example, chemical vapor deposition (CVD), atomic layer deposition (ALD), electroless plating, electroplating, or a combination thereof.

In some embodiments, the plurality of first bottom vias 1804 may be formed in the first area 404. One first bottom via 1804 may be formed to electrically couple to the first source region 1204 and another first bottom via 1804 may be formed to electrically couple to the first drain region 1206. The plurality of second bottom vias 1806 may be formed in the second area 406. One second bottom via 1806 may be formed to electrically couple to the second source region 1208 and another second bottom via 1806 may be formed to electrically couple to the second drain region 1210.

Figure 19:
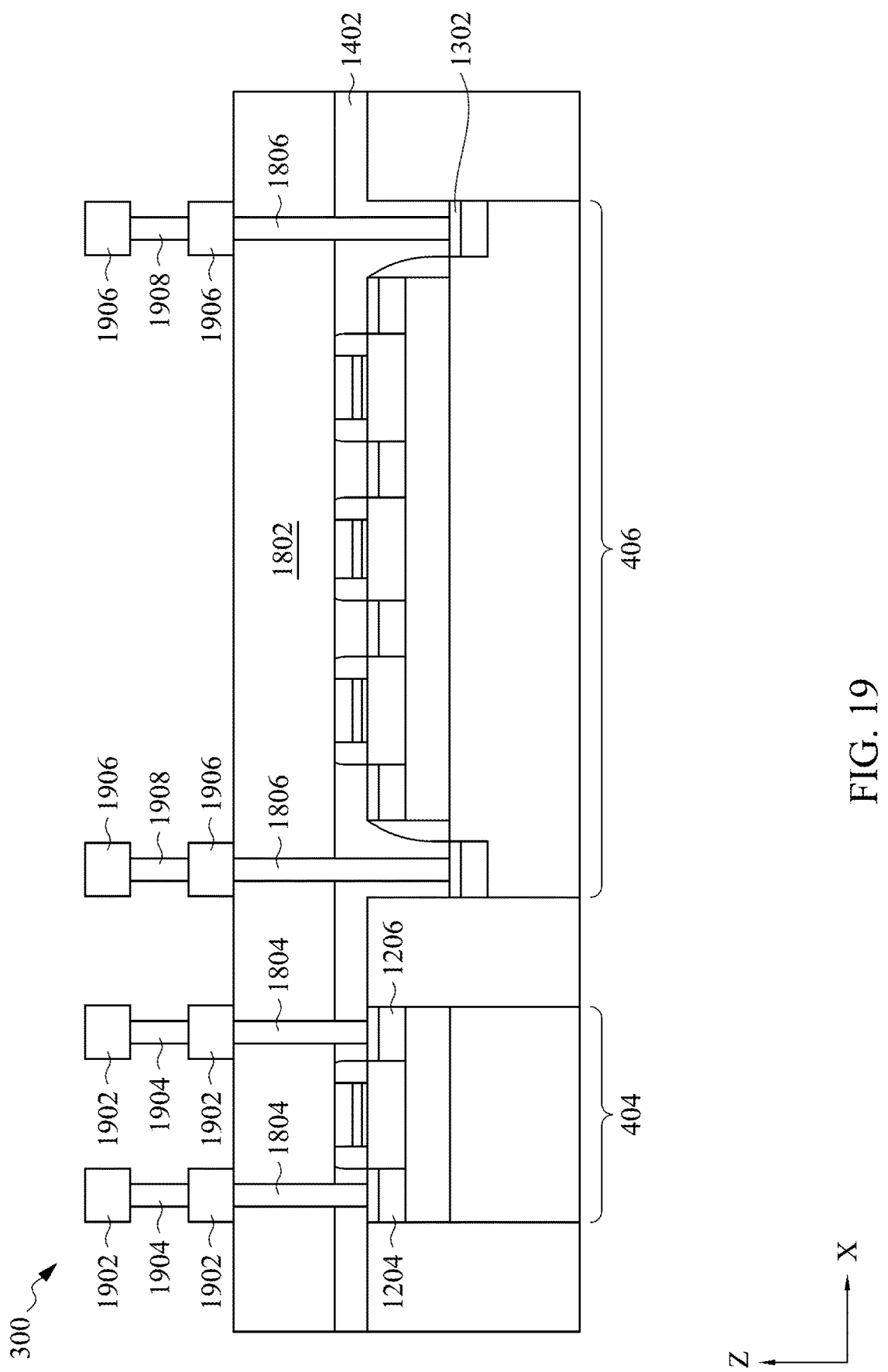

Corresponding to operation 232 of FIG. 2, FIG. 19 illustrates a cross-sectional view cut along the X-direction of the semiconductor device 300 in which a plurality of intermediate interconnect structures 1902 and 1906 and a plurality of intermediate vias 1904 and 1908 are formed, in accordance with some embodiments.

In some embodiments, a plurality of first intermediate interconnect structures 1902 and a plurality of second intermediate interconnect structures 1906, both extending horizontally, may be formed above and electrically coupled to the first bottom vias 1804 and the second bottom vias 1806, respectively. The intermediate interconnect structures 1902 and 1906 may be formed from a metallic material including at least one metal material selected from the group consisting of tungsten, copper, cobalt, ruthenium, titanium, tantalum, or combinations thereof. The plurality of intermediate interconnect structures can be formed by a conformal deposition method, which can be, for example, chemical vapor deposition (CVD), atomic layer deposition (ALD), electroless plating, electroplating, or a combination thereof.

In the first area, the plurality of first intermediate interconnect structures 1902 are formed directly above and electrically coupled to the first bottom vias 1804. A plurality of first intermediate vias 1904 (e.g., substantially similar to the bottom vias 1804 and 1806) may be formed above and electrically coupled to the first intermediate interconnect structures 1902. Another plurality of first intermediate interconnect structures 1902 may then be formed above and electrically coupled to the first intermediate vias 1904. It is understood that the number of first intermediate interconnect structures 1902 is not limited to four and the number of first intermediate vias 1904 is not limited to two, and that any suitable number of metal structures may be formed in the semiconductor device 300.

In the second area, the plurality of second intermediate interconnect structures 1906 are formed directly above and electrically coupled to the first bottom vias 1806. A plurality of second intermediate vias 1908 (e.g., substantially similar to the bottom vias 1804 and 1806) may be formed above and electrically coupled to the second intermediate interconnect structures 1906. Another plurality of second intermediate interconnect structures 1906 may then be formed above and electrically coupled to the second intermediate vias 1908. It is understood that the number of second intermediate interconnect structures 1906 is not limited to four and the number of second intermediate vias 1908 is not limited to two, and that any suitable number of metal structures may be formed in the semiconductor device 300.

Figure 20:
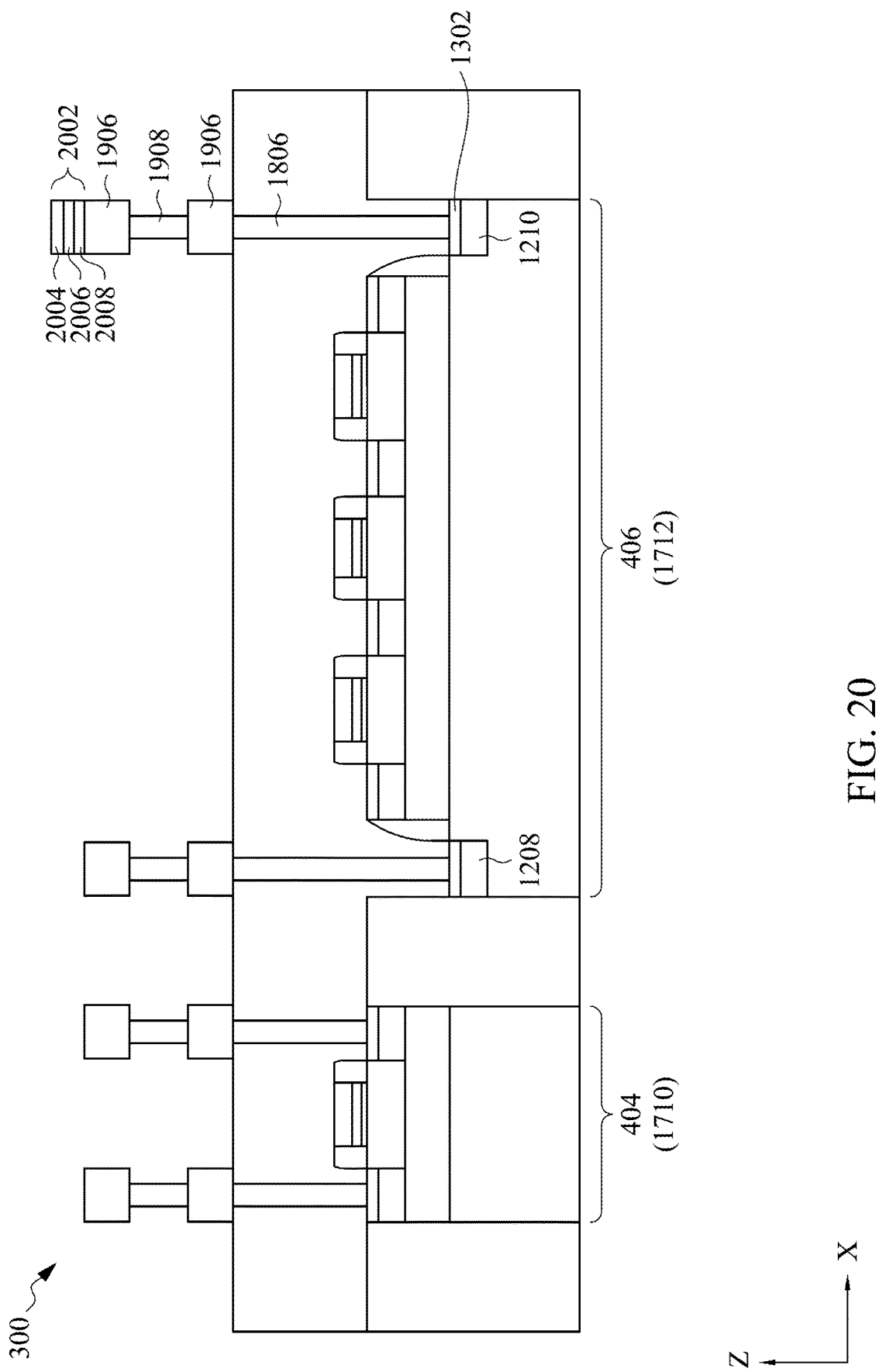

Corresponding to operation 234 of FIG. 2, FIG. 20 illustrates a cross-sectional view cut along the X-direction of the semiconductor device 300 in which a memory component 2002 is formed, in accordance with some embodiments.

The memory component 2002 may be disposed above the first transistor 1710 and the second transistor 1712. For example, the memory component 2002 is formed directly above the second transistor 1712, as shown in FIG. 20. Although one memory component is shown in the example of FIG. 20, it should be understood that the semiconductor device 300 can include a number of similar memory components (e.g., formed as an array) disposed above the transistors 1710 and 1712. The memory component 2002 is formed on a top surface of a second intermediate interconnect structure 1906. The memory component 2002 may also be electrically coupled to the second source region 1208 or the second drain region 1210 via the second intermediate interconnect structures 1906, the second intermediate via 1908, and the second bottom via 1806, as shown in FIG. 20. In some embodiments, the silicide layer 1302 may reduce the contact resistance between the memory component 2002 and the second source region 1208 or the second drain region 1210.

In some embodiments, the memory component 2002 may be part of a resistive random access memory (RRAM) cell. For example, the memory component 2002 may be a resistor with a variable resistance value (sometimes referred to as an "RRAM resistor") and the resistor is serially connected to the second transistor 1712, which can function as an access transistor of an RRAM cell. For example, the second transistor 1712, when activated through an asserted word line gating its gate (e.g., the first doped silicon gates 502 and the second doped silicon gates 1212), can allow the RRAM resistor 2002 to be programmed or read. Accordingly, the RRAM resistor (e.g., 2002) and the access transistor (e.g., 1712) can serve a single RRAM cell, which is sometimes referred to as a one-transistor-one-resistor (1T1R) configuration. It, however, should be understood that any of various other RRAM configurations that exhibit the characteristic of variable resistance and multi-threshold voltages may be used by the RRAM cell such as, for example, a many-transistors-one-resistor (manyT1R) configuration, etc., while remaining within the scope of the present disclosure.

The RRAM resistor 2002 may be formed as a multi-layer stack that includes a top electrode (TE) 2004, a capping layer (not shown), a variable resistance dielectric (VRD) layer 2006, and a bottom electrode (BE) 2008. The TE 2004 may be formed from at least one of the materials selected from: Pt, TiN/Ti, TiN, Ru, Ni, and combinations thereof; the capping layer may be formed from at least one of the transition metal materials such as, Ti, Ni, Hf, Nb, Co, Fe, Cu, V, Ta, W, Cr, and combinations thereof; the VRD layer 2006 may be formed from at least one of the transition metal oxide materials such as, TiOx, NiOx, HfOx, NbOx, CoOx, FeOx, CuOx, VOx, TaOx, WOx, CrOx, and combinations thereof; and the BE 2008 may be formed of at least one of the materials selected from: TiN, TaN, W, Pt, and combinations thereof. In some embodiments, the VRD layer 2006 may include a high-k dielectric layer. In general, the VRD layer 2006 may be formed by deposition, for example, atomic layer deposition (ALD), chemical vapor deposition (CVD), meta-organic chemical vapor deposition (MOCVD), etc., to have a particular thickness and crystalline structure using a particular manufacturing process recipe.

In other embodiments, the memory component 2002 can include a ferroelectric random access memory (FeRAM) component, a phase-change random access memory (PCRAM) component, a magnetic tunnel junction random access memory (MTJ RAM) component, a spin transfer torque magnetic random access memory (STT-MRAM) component, a magnetoresistive (MRAM) random access memory component, etc.

Figure 21:
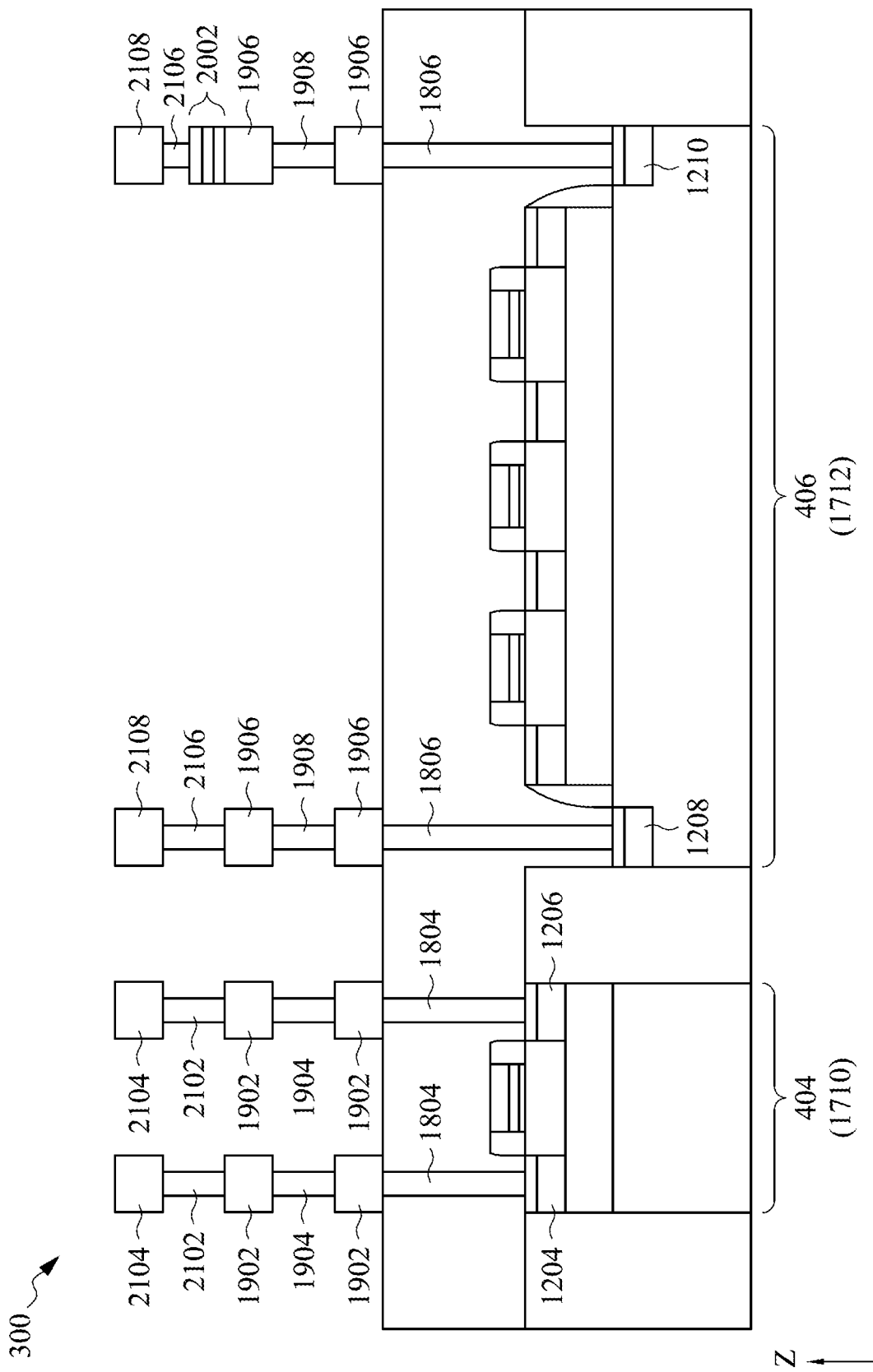

Corresponding to operation 236 of FIG. 2, FIG. 21 illustrates a cross-sectional view along the X-direction of the semiconductor device 300 in which a plurality of top vias 2102 and 2106 and a plurality of top interconnect structures 2104 and 2108 are formed, in accordance with some embodiments.

In some embodiments, a plurality of first top vias 2102 and second top vias 2106 may be formed directly above and electrically coupled to either the first intermediate interconnect structures 1902, the second intermediate interconnect structures 1906, or the memory cell 2002. The first top vias 2102 and the second top vias 2106 are substantially similar to the first intermediate vias 1904 and the second intermediate vias 1908, respectively. In the first area 404, the first top vias 2102 are formed directly above and electrically coupled to the first intermediate interconnect structures 1902. The first top vias 2102 are therefore electrically coupled to the first source region 1204 and the first drain region 1206. In the second area 406, the second top vias 2106 are formed directly above and electrically coupled to either the second intermediate interconnect structures 1906 or the memory component 2002. In some embodiments where the second top via 2106 is electrically coupled to the memory component 2002, the second top via 2106 may be a height in the Z-direction less than a height of the other second top vias 2106 or the first top vias 2102. The second top vias 2106 are also therefore electrically coupled to the second source region 1208 and the second drain region 1210. It is understood that the number of first top vias 2102 is not limited to two and the number of second top vias 2106 is not limited to two, and that any suitable number of metal structures may be formed in the semiconductor device 300.

A plurality of first top interconnect structures 2104 and second top interconnect structures 2108 may then be formed directly above and electrically coupled to the first top vias 2102 and the second top vias 2106, respectively. The first top interconnect structures 2104 and the second top interconnect structures 2108 are substantially similar to the first intermediate interconnect structures 1902 and the second intermediate interconnect structures 1906, respectively. In the first area 404, the first top interconnect structures 2104 are formed directly above and electrically coupled to the first top vias 2102. The first top interconnect structures 2104 are therefore electrically coupled to the first source region 1204 and the first drain region 1206. In the second area 406, the second top interconnect structures 2108 are formed directly above and electrically coupled to either the second top vias 2106. The second top interconnect structures 2108 are also therefore electrically coupled to the second source region 1208 and the second drain region 1210. It is understood that the number of first top interconnect structures 2104 is not limited to two and the number of second top interconnect structures 2108 is not limited to two, and that any suitable number of metal structures may be formed in the semiconductor device 300.

Figure 22:
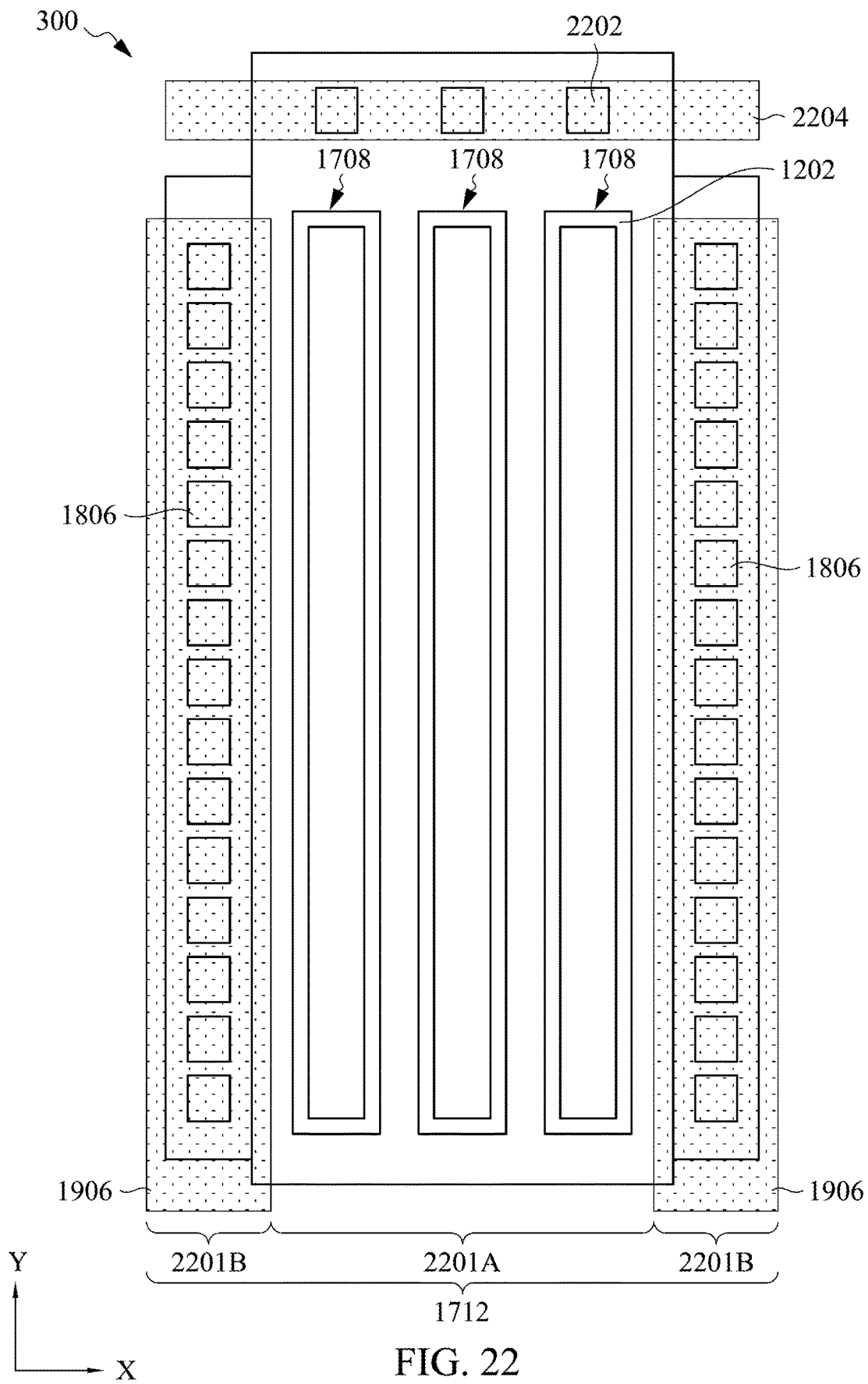
FIGS. 22, 23, and 24 illustrate cross-sectional views of the second area of the example semiconductor device, in accordance with some embodiments.
Figure 23:
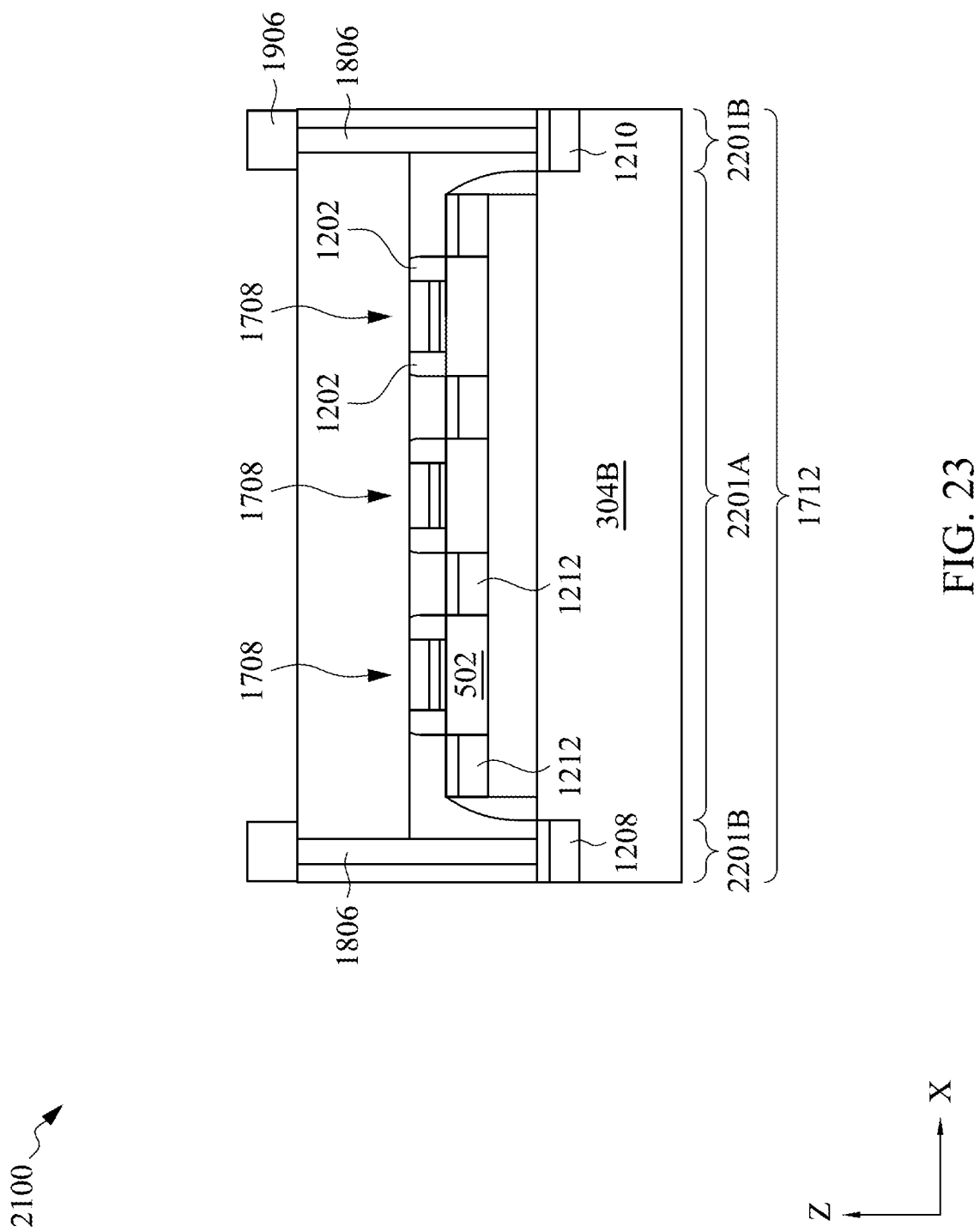
Figure 24:
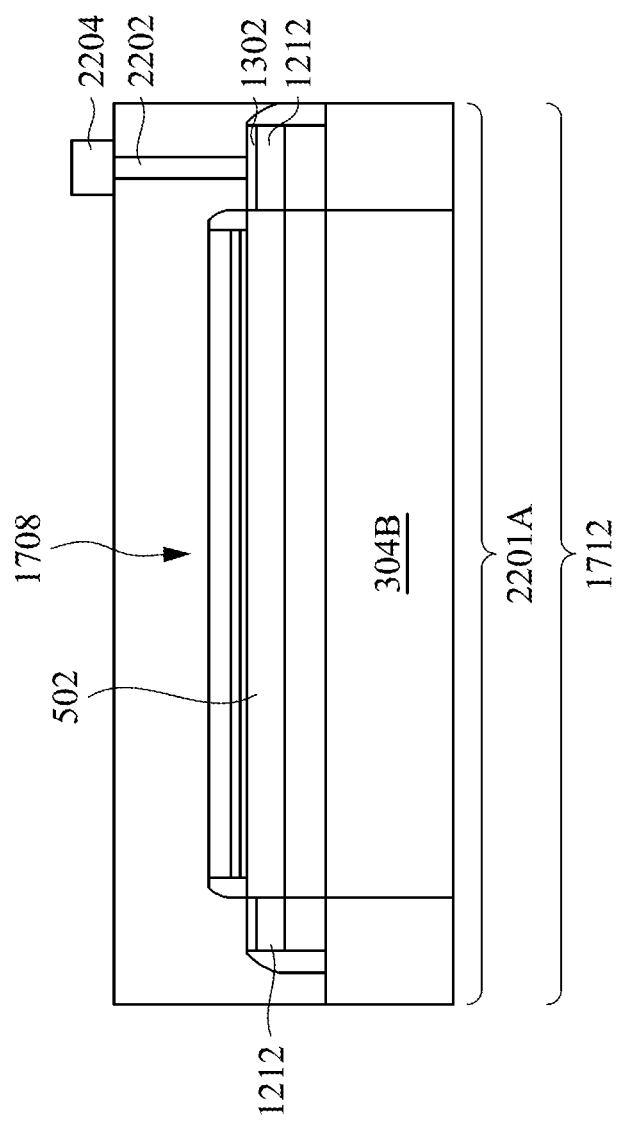

To further illustrate the device(s) formed in the second area 406, FIG. 22 illustrates a top view of an embodiment of the second transistor 1712, and FIGS. 23 and 24 illustrate cross-sectional views of the second transistor 1712 of FIG. 22 cut along the X-direction and along the Y-direction, respectively, in accordance with some embodiments.

As shown in FIG. 22, a first portion of an active area of the second transistor 1712, 2201A, may extend along the X-direction with a first distance (sometimes referred to as a length) and the Y-direction with a second distance (sometimes referred to as a width), respectively. The second metal gate structures 1708, extending continuously along the Y-direction, may be disposed in the first portion 2201A and spaced from one another along the X-direction. Further, second portions of the active area of the second transistor 1712, 2201B, may be disposed on opposite sides of the first portion 2201A along the X-direction. In various embodiments, the first portion 2201A may be configured to incorporate a channel of the second transistor 1712, and the second portion 2201B may each be configured to form source/drain regions of the second transistor 1712.

Referring still to FIG. 22, a plurality of second bottom vias 1806 may be disposed in each of the second portion 2201B and spaced apart from each other along the Y-direction, and a plurality of third bottom vias 2202 may be disposed in the first portion 2201A and spaced apart from each other along the X-direction. Further, in the example of FIG. 22, the third bottom vias 2202 may be displaced from the second metal gate structures 1708 (that are also disposed in the first portion 2201A), i.e., the third bottom vias 2202 and the second metal gate structures 1708 not overlapping with each other. In the Y-direction, the number of second bottom vias 1806 may be any suitable number. In the X-direction, the number of third bottom vias 2202 may be equal to the number of metal gate structures 1708. Stated alternatively, each of the third bottom vias 2202 can be coupled to a corresponding one of the metal gate structures 1708. The second bottom vias 1806 may be electrically coupled together by the second intermediate interconnect structure 1906 that continuously extends along the Y-direction. The plurality of third bottom vias 2202 may be electrically coupled together by a third intermediate interconnect structure 2204 (e.g., substantially similar to the second intermediate interconnect structures 1906 of FIG. 19) that may be formed directly above the third bottom vias 2202.

Referring next to FIG. 23 a cross-sectional view of the second transistor 1712 cut along the X-direction is shown. In addition to the second metal gate structures 1708, the first portion 2201A includes first doped silicon gates 502 and second doped silicon gates 1212 collectively overlaying a portion of the second lower silicon layer 304B, which can serve as a channel of the second transistor 1712. The second portion 2201B further includes the second source region 1208 and second drain region 1210 disposed one the sides of such a channel (along the X-direction) and coupled to the respective second bottom vias 1806.

Referring then to FIG. 24, a cross-sectional view of the second transistor 1712 cut along the Y-direction is shown. Further, the cross-sectional view of FIG. 24 is cut across one of the first doped silicon gates 502 (i.e., one of the second metal gate structures 1708 being shown). As shown, the second metal gate structure 1708 extends continuously along the Y-direction. The first doped silicon gate 502 is mainly overlaid by such a second metal gate structure 1708, with portions of the second doped silicon gates 1212 disposed on opposite sides of the first doped silicon gate 502 along the Y-direction. Accordingly, it should be understood that the second doped silicon gates 1212 may be formed as a continuous (or one-piece) structure that includes a number of portions respectively surrounding the discretely arranged first doped silicon gates 502 (as discussed with respect to FIG. 12). In other words, within the first portion 2201A (FIG. 22), a majority portion that is not occupied by the first doped silicon gates 502 may be occupied by the second doped silicon gate 1212. Further, each third bottom via 2202 is coupled to a corresponding one of the first doped silicon gates 502 through at least a portion of the second doped silicon gate 1212 and a portion of the silicide layer 1302 formed thereon.

Figure 25:
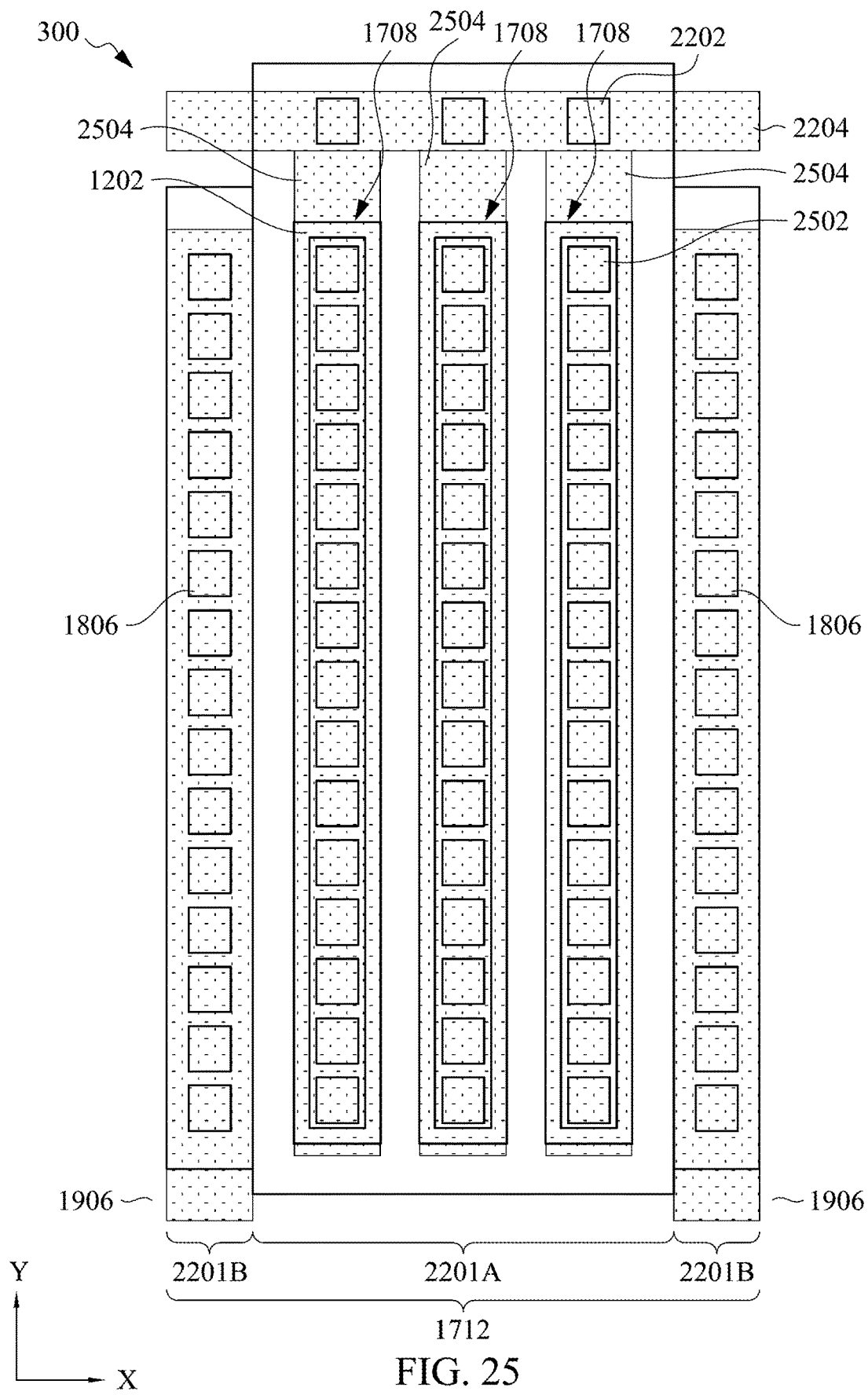
FIGS. 25, 26, and 27 illustrate cross-sectional views of the second area of the example semiconductor device, in accordance with some embodiments.

To illustrate another possible configuration of the second area 406 of the semiconductor device 300, FIG. 25 illustrates a top view of an embodiment of the second transistor 1712, and FIGS. 23 and 24 illustrate cross-sectional views of the second transistor of 1712 cut along the X-direction and along the Y-direction, respectively, of the semiconductor device 300 in which a plurality of metal gate vias 2502 are formed, in accordance with some embodiments.

Figure 26:
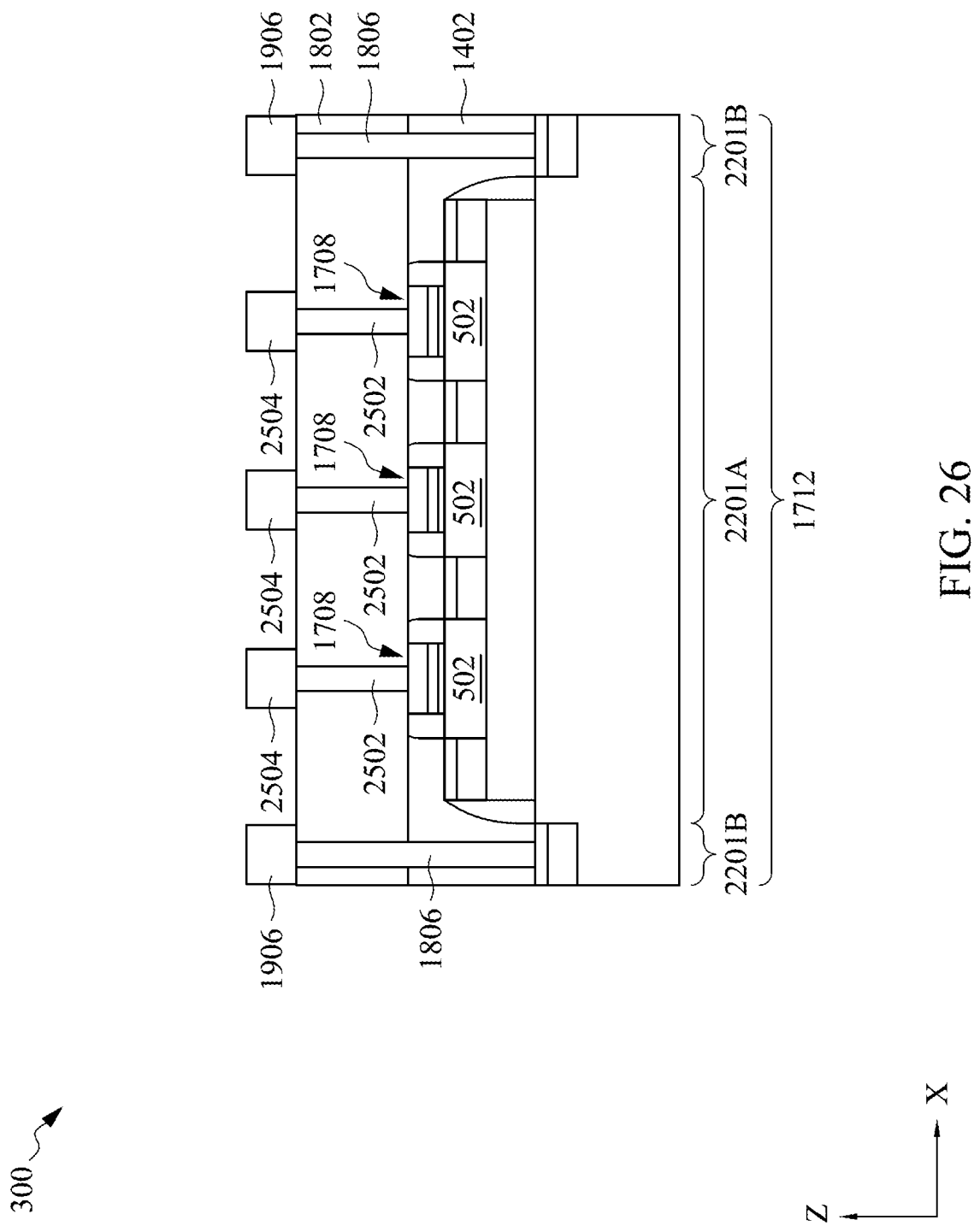

As shown in FIG. 25, the second metal gate structures 1708 may extend continuously along the Y-direction, and may be disposed in the first portion 2501A and spaced apart from one another along the X-direction. Referring still to FIG. 25, the plurality of metal gate vias 2502 are formed directly above and electrically coupled to the second metal gate structures 1708 in the first portion 2201A. The metal gate vias 2502 may be spaced apart from each other along the Y-direction. The number of metal gate vias 2502 on one second metal gate structure 1708 may equal the number of second bottom vias 1806 on one of the second portions 2201B. Referring next to FIG. 26, a cross-sectional view of the second transistor 1712 cut along the X-direction is shown. In the first portion 2201A, the metal gate vias 2502 extend vertically in the Z-direction and may be formed through a dual-damascene or single-damascene process by forming one or more vertical trenches extending through the first ILD 1402 and the second ILD 1802 and configured to expose a top surface of a source region or a drain region. These trenches may then be filled with a metallic fill material. The metallic fill material includes at least one metal material selected from the group consisting of tungsten, copper, cobalt, ruthenium, titanium, tantalum, or combinations thereof. The metallic fill material can be deposited by a conformal deposition method, which can be, for example, chemical vapor deposition (CVD), atomic layer deposition (ALD), electroless plating, electroplating, or a combination thereof.

As shown in FIG. 26, a plurality of metal gate interconnect structures 2504 are formed directly above and electrically coupled to the metal gate vias 2502 In FIG. 25, the metal gate interconnect structures 2504 extend to contact the third intermediate interconnect structure 2204. The plurality of metal gate interconnect structures 2504 may be formed from a metallic material including at least one metal material selected from the group consisting of tungsten, copper, cobalt, ruthenium, titanium, tantalum, or combinations thereof. The plurality of metal gate interconnect structures can be formed by a conformal deposition method, which can be, for example, chemical vapor deposition (CVD), atomic layer deposition (ALD), electroless plating, electroplating, or a combination thereof.

Figure 27:
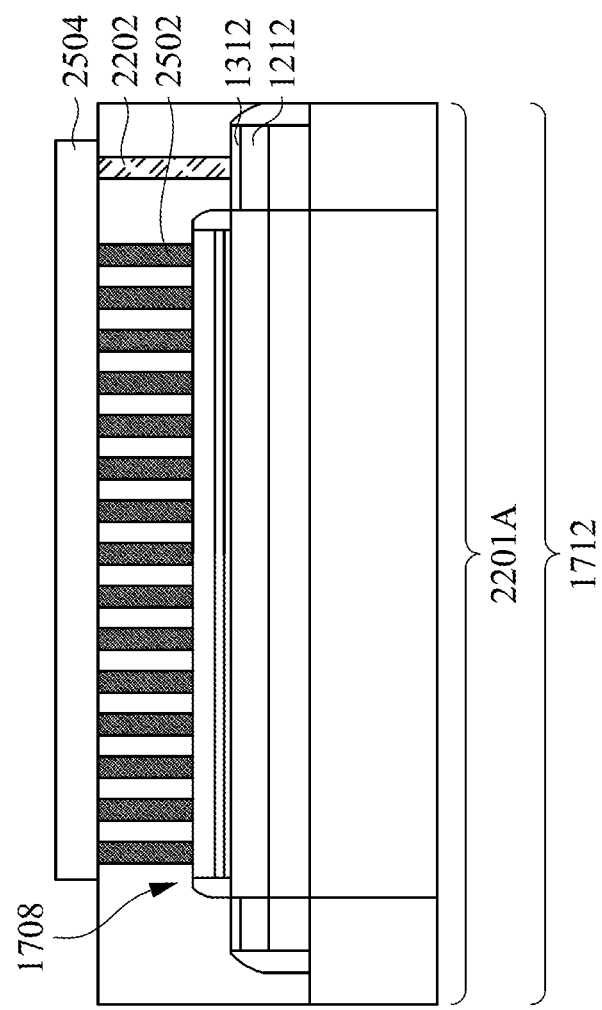

Referring next to FIG. 27 a cross-sectional view of the second transistor 1712 cut along the Y-direction is shown. Further, the cross-sectional view of FIG. 27 is cut across one of the first doped silicon gates 502 (i.e., one of the second metal gate structures 1708 being shown). The metal gate interconnect structures 2504 are further electrically coupled to the second metal gate structures 1708. the metal gate interconnect structures 2504 may continuously extend along the Y-direction and contact the third intermediate interconnect structure 2204 to electrically couple the plurality of metal gate vias 2502 on one second metal gate structure 1708 and the corresponding third bottom via 2202. Each second metal gate structure 1708 may include a metal gate interconnect structure 2504 disposed above it. It is understood that for purposes of clarity, the semiconductor device 300 in FIGS. 25, 26, and 27 may not illustrate various components such as memory cells and more metal structures.

FIGS. 28, 29, 30, 31, 32, and 33 illustrate top views of the second area 406 of the semiconductor device 300, in accordance with some embodiments.

Figure 28:
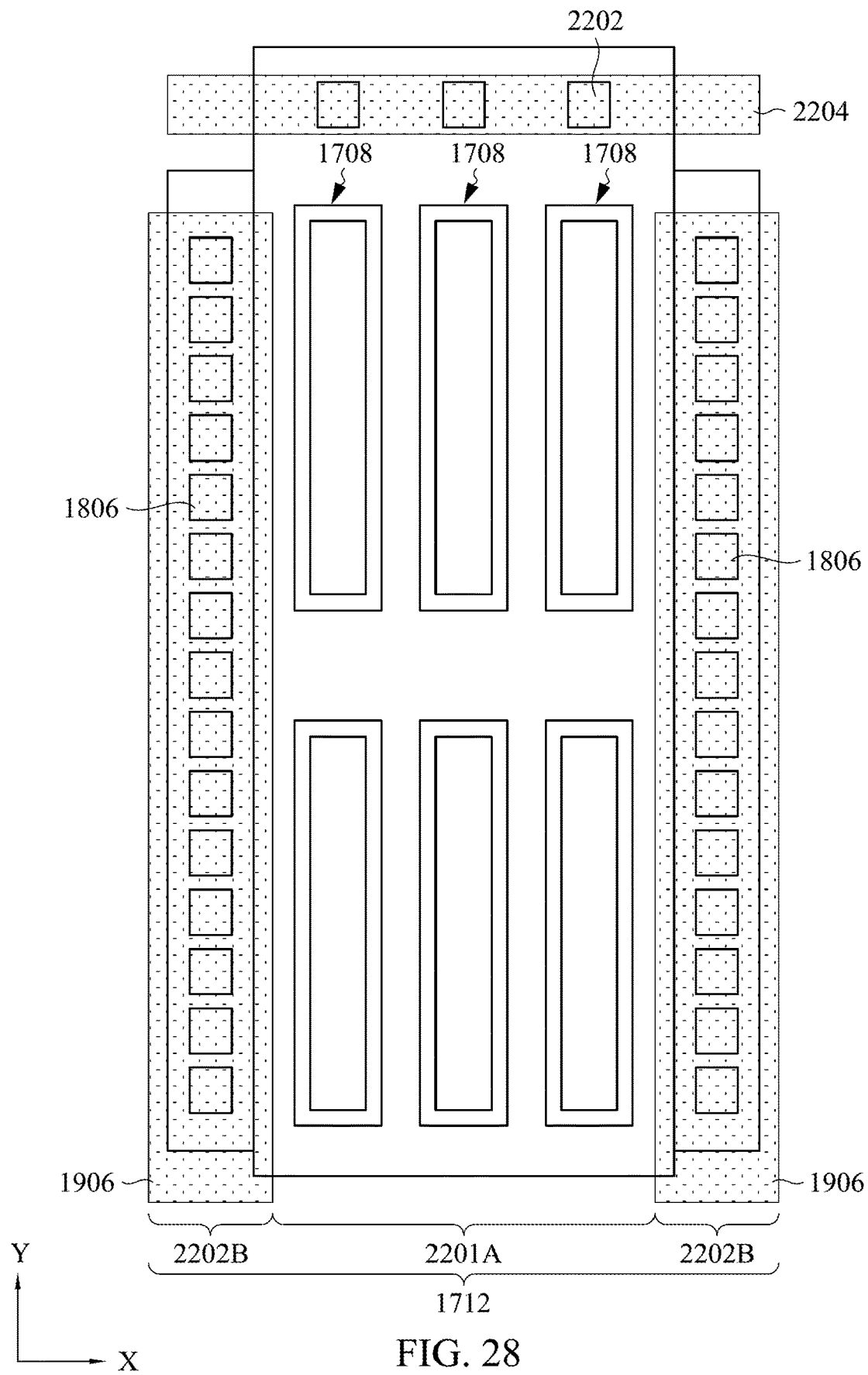
FIG. 28 illustrates a cross-sectional view of the second area of the example semiconductor device, in accordance with some embodiments.
Figure 29:
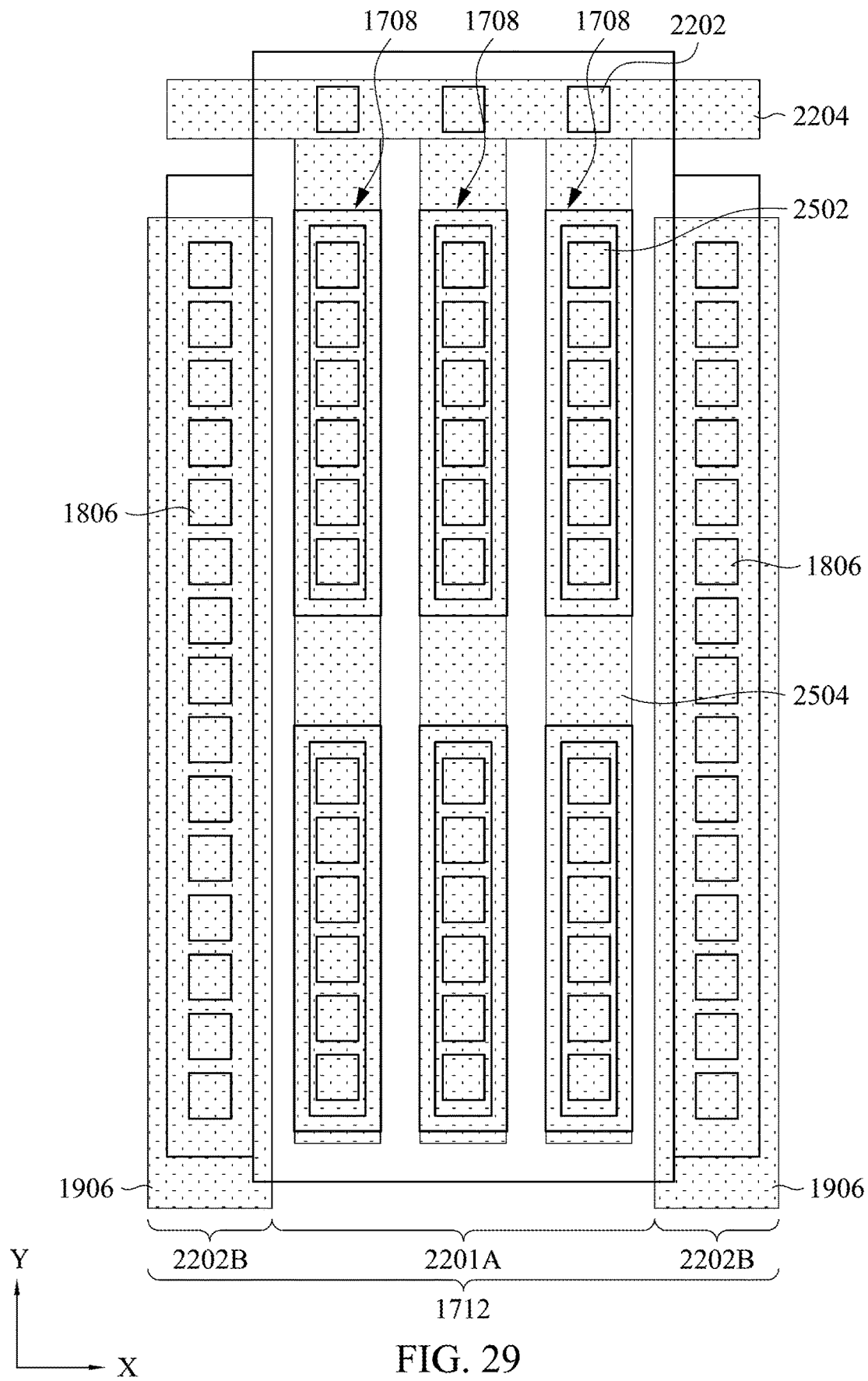
FIG. 29 illustrates a cross-sectional view of the second area of the example semiconductor device, in accordance with some embodiments.

In each of FIGS. 28-33, the second area 406 comprises the plurality of second bottom vias 1806 along the Y-direction and the plurality of third bottom vias 2202 along the X-direction. In FIG. 28, each third bottom via 2202 may correspond to two second metal gate structures 1708 both extending along the Y-direction in the first portion 2201A. It is understood that the second metal gate structures 1708 are rectangular but can also be any suitable shape such as trapezoidal, oval-like, etc. In FIG. 29, the second metal gate structures 1708 of FIG. 28 may have a plurality of metal gate vias 2502 disposed directly above and electrically coupled to the second metal gate structures 1708 in the first portion 2201A. In some embodiments, the metal gate vias 2502 in the first portion 2201A may align with the second bottom vias 1806 in the second portion 2201B. The metal gate interconnect structures 2504 and the third intermediate interconnect structures 2204 may electrically couple two second metal gate structures 1708, a portion of the plurality of metal gate vias 2502, and the third bottom vias 2202.

Figure 30:
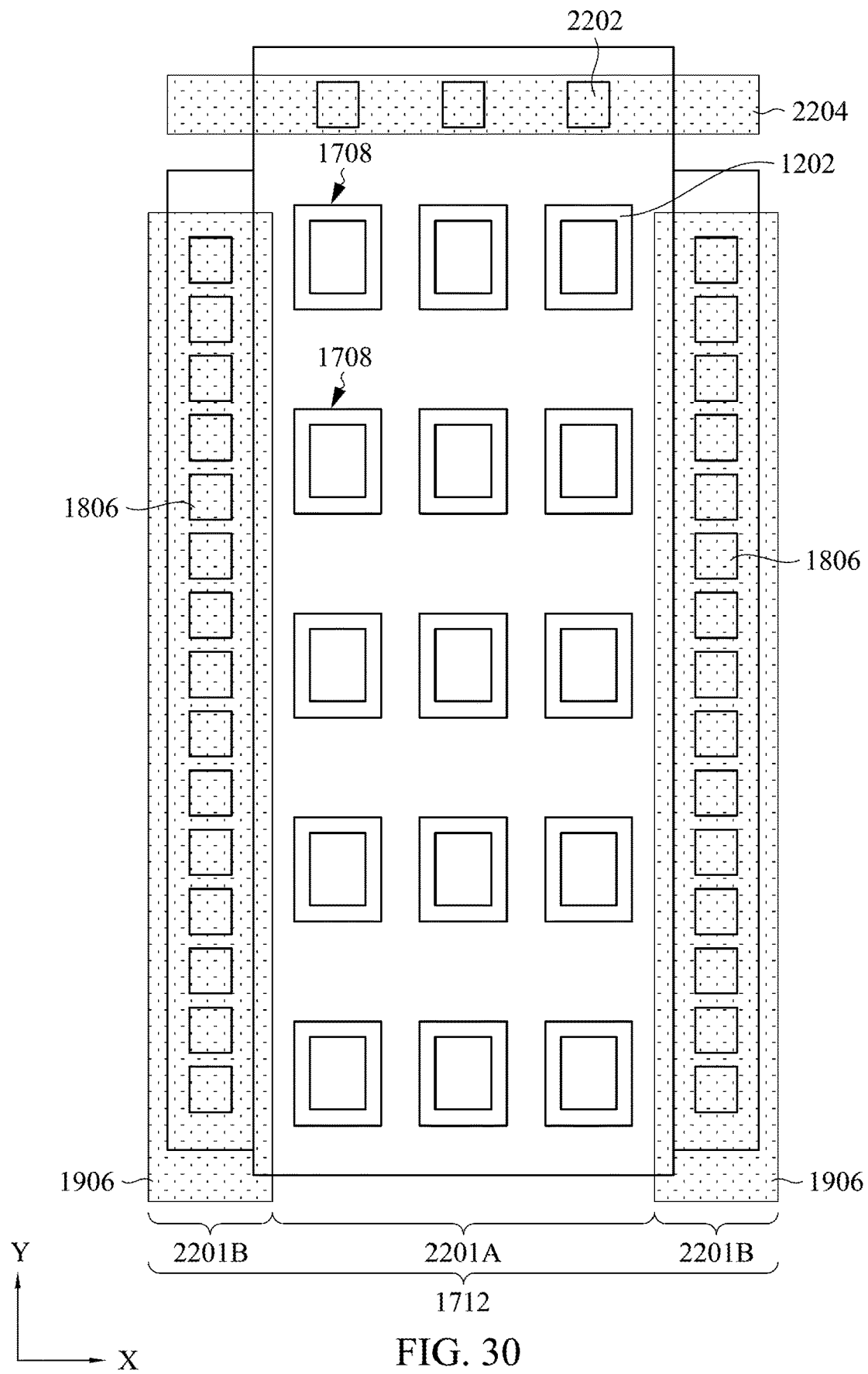
FIG. 30 illustrates a cross-sectional view of the second area of the example semiconductor device, in accordance with some embodiments.
Figure 31:
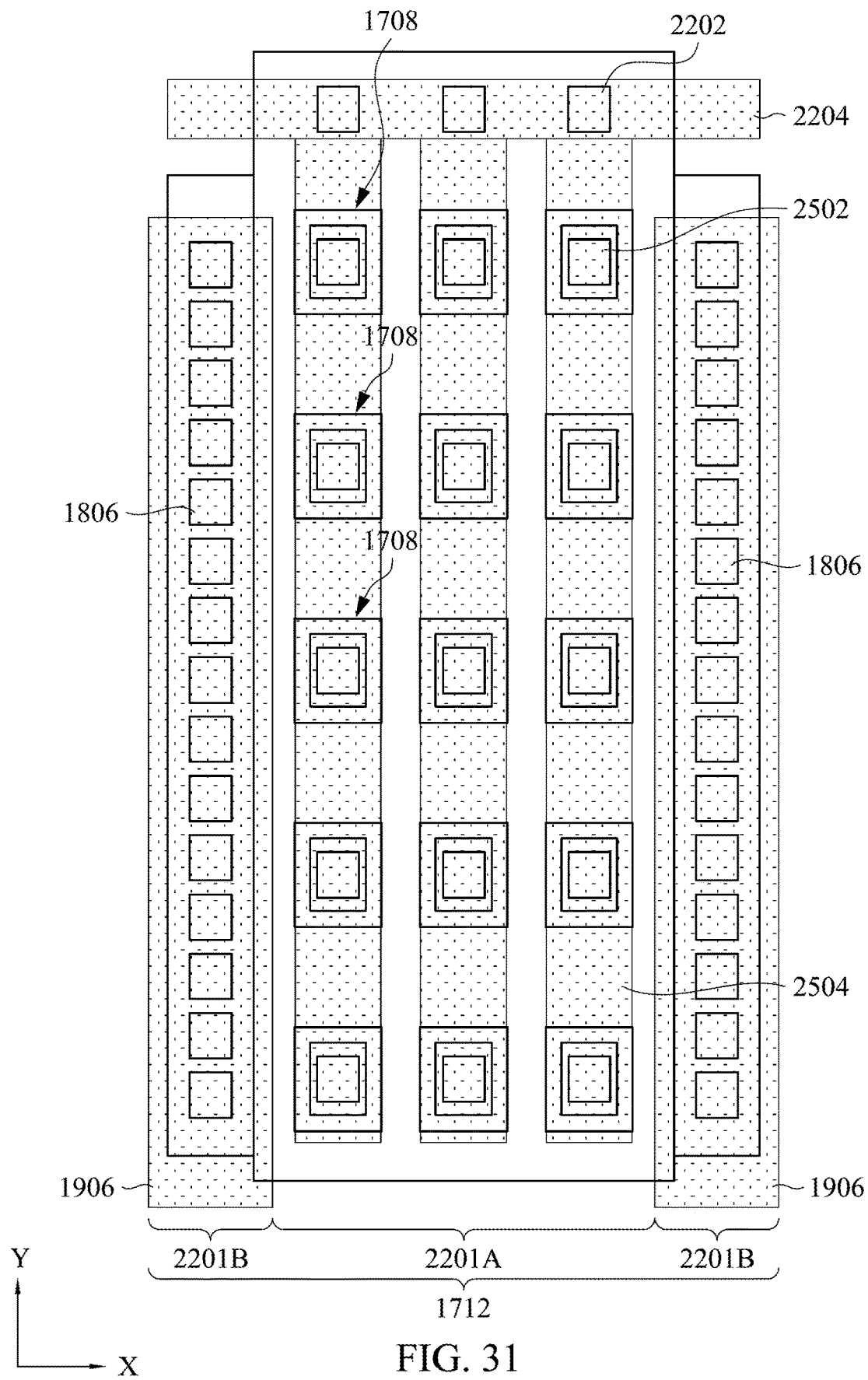
FIG. 31 illustrates a cross-sectional view of the second area of the example semiconductor device, in accordance with some embodiments.

In FIG. 30, each third bottom via 2202 in the first portion 2201A may correspond to a plurality of second metal gate structures 1708 in the first portion 2201A along the Y-direction. The second metal gate structures 1708 may be arranged in rows and columns. The second metal gate structures 1708 may comprise a square shape, but it is understood the second metal gate structures 1708 may be any suitable shape such as rectangular, circular, triangular, oval-like, etc. In FIG. 31, each second metal gate structure 1708 of FIG. 30 may have a single metal gate via 2502 formed above and electrically coupled to each second metal gate structure 1708 in the first portion 2201A. In some embodiments, the metal gate vias 2502 may be larger than the second bottom vias 1806 and the third bottom vias 2202. The metal gate interconnect structures 2504 and the third intermediate interconnect structures 2204 may electrically couple a column of the second metal gate structures 1708, a portion of the plurality of metal gate vias 2502, and the third bottom vias 2202.

Figure 32:
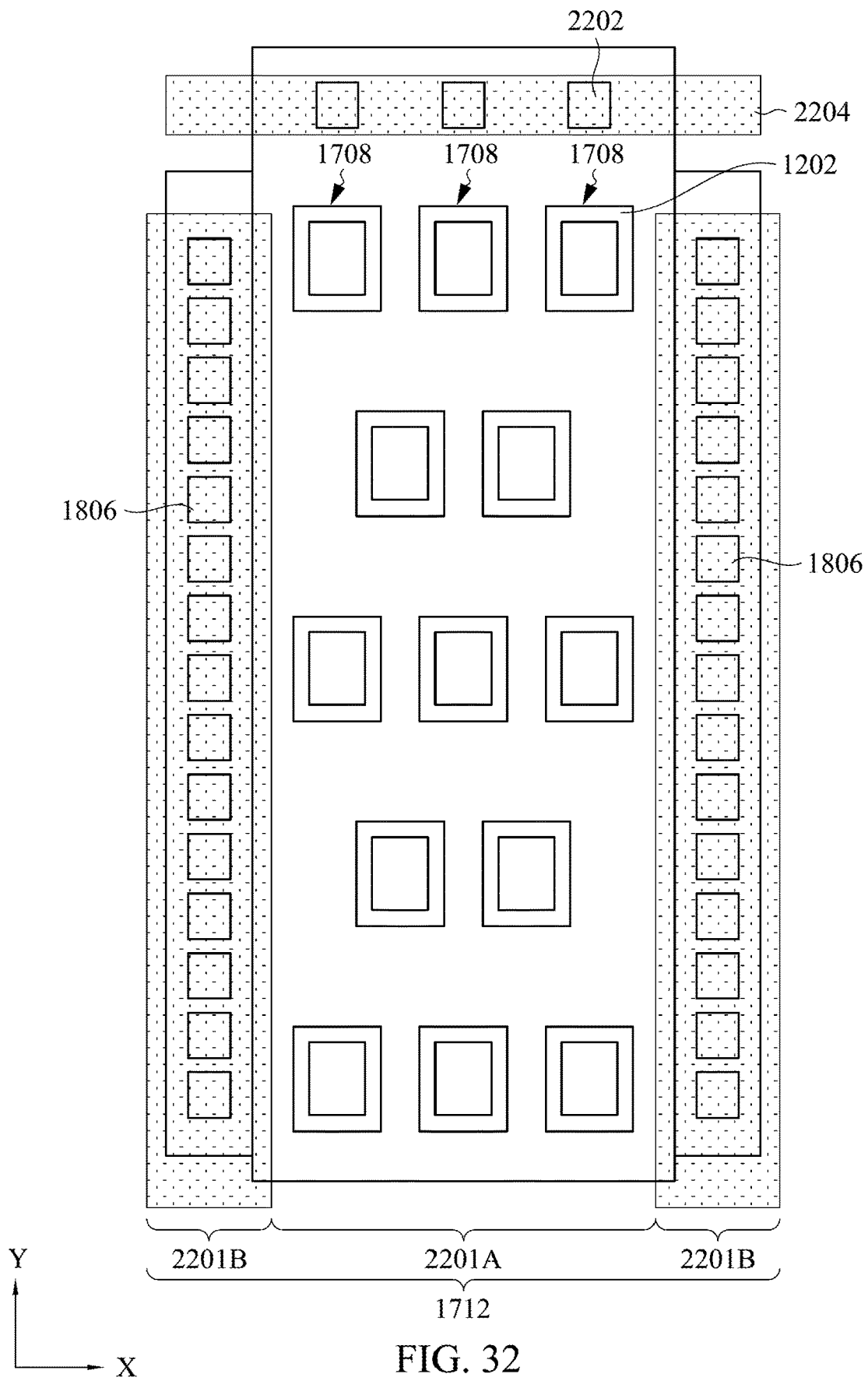
FIG. 32 illustrates a cross-sectional view of the second area of the example semiconductor device, in accordance with some embodiments.
Figure 33:
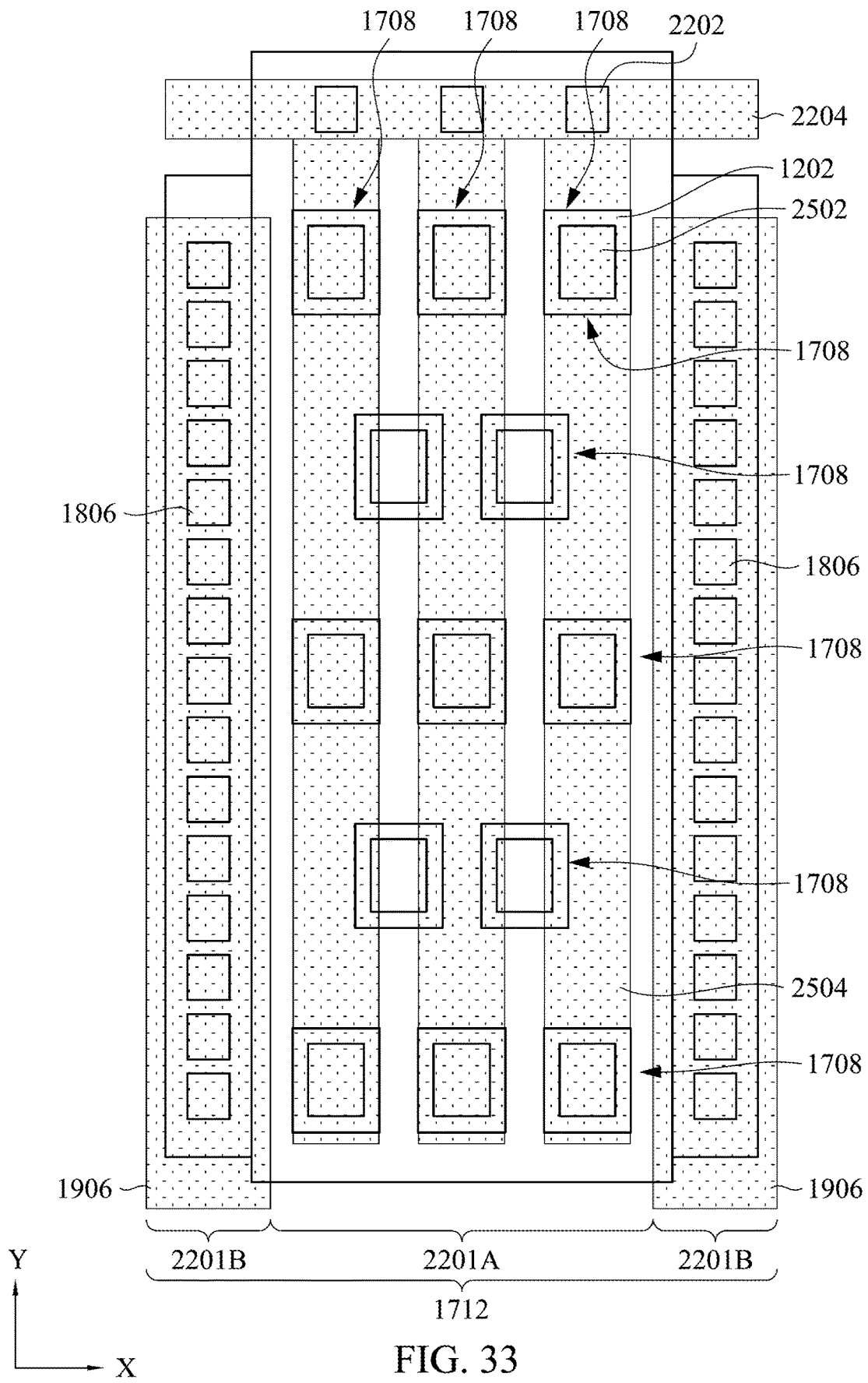
FIG. 33 illustrates a cross-sectional view of the second area of the example semiconductor device, in accordance with some embodiments.

In FIG. 32, the second transistor 1712 may comprise a plurality of second metal gate structures 1708 in a staggered configuration in the first portion 2201A. The second metal gate structures 1708 may be configured in rows staggered from each other. The second metal gate structures 1708 may comprise a square shape, but it is understood the second metal gate structures 1708 may be any suitable shape such as rectangular, circular, triangular, oval-like, etc. In FIG. 33, each second metal gate structure 1708 of FIG. 32 may have a single metal gate via 2502 formed above and electrically coupled to each second metal gate structure 1708 in the first portion 2201A. In some embodiments, the metal gate vias 2502 may be larger than the second bottom vias 1806 and the third bottom vias 2202. Each of the metal gate vias 2502 may be in contact with at least one metal gate interconnect structure 2504. The metal gate interconnect structures 2504 and the third intermediate interconnect structures 2204 may electrically couple a number of second metal gate structures 1708, a portion of the plurality of metal gate vias 2502, and the third bottom vias 2202. It is understood that FIGS. 28-33 are not limiting embodiments of the second area 406 of the semiconductor device 300, and that any suitable configuration or combination of configurations may be seen for the metal gate structures 1708.

In one aspect of the present disclosure, a semiconductor device is disclosed. The semiconductor device includes a lower silicon layer comprising a first area and a second area. The lower silicon layer in the first area includes a first silicon oxide layer, a first upper silicon layer disposed above the first silicon oxide layer, and a first metal gate disposed above the first upper silicon layer. The lower silicon layer in the second area includes a second silicon oxide layer, a plurality of first doped silicon gates disposed above the second silicon oxide layer, and a plurality of portions of a second doped silicon gate disposed above the second silicon oxide layer. The plurality of first doped silicon gates and the plurality of portions of the second doped silicon gate are alternatively arranged with each other. The lower silicon layer in the second area also includes a plurality of second metal gates disposed directly above the plurality of first doped silicon gates, respectively.

In another aspect of the present disclosure, a semiconductor device is disclosed. The semiconductor device includes a first transistor comprising a first silicon layer, a high-k dielectric layer disposed above the first silicon layer, a first metal gate disposed above the high-k dielectric layer, and a first source region and a first drain region disposed within the first silicon layer. The semiconductor device further includes a second transistor comprising a second silicon layer, a first silicon oxide layer disposed above the second silicon layer, a plurality of first doped silicon gates disposed above the first silicon oxide layer, and a plurality of portions of a second doped silicon gate disposed above the first silicon oxide layer. The plurality of first doped silicon gates and the plurality of portions of the second doped silicon gate are alternatively arranged with each other. The second transistor further comprises a second source region and a second drain region disposed within the second silicon layer. The semiconductor device further comprises a memory cell disposed above the first and second transistors, and electrically coupled to the second source region or the second drain region.

In yet another aspect of the present disclosure, a method for fabricating semiconductor devices is disclosed. The method includes defining a first area and a second area of a silicon-on-insulator (SOI) substrate. The SOI substrate, in the first area, comprises a first lower silicon layer, a first silicon oxide layer above the first lower silicon layer, and a first upper silicon layer above the first silicon oxide layer. The SOI substrate, in the second area, comprises a second lower silicon layer, a second silicon oxide layer above the second lower silicon layer, and a second upper silicon above the second silicon oxide layer. The method further includes doping the second upper silicon layer. The method further includes concurrently forming a first poly gate over the first upper silicon layer and forming a plurality of second poly gates over the second upper silicon layer being doped. The method further includes overlaying the first poly gate and the plurality of second poly gates with a first interlayer dielectric layer (ILD). The method further includes polishing the first ILD until the first poly gate and the plurality of second poly gates are re-exposed. The method further includes the first poly gate and the plurality of second poly gates with a first metal gate and a plurality of second metal gates, respectively.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a lower silicon layer comprising a first area and a second area;
 wherein the lower silicon layer, in the first area, comprises:
  a first silicon oxide layer;
  a first upper silicon layer disposed above the first silicon oxide layer; and
  a first metal gate disposed above the first upper silicon layer;
 wherein the lower silicon layer, in the second area, comprises:
  a second silicon oxide layer;
  a plurality of first doped silicon gates disposed above the second silicon oxide layer;
  a plurality of portions of a second doped silicon gate disposed above the second silicon oxide layer, wherein the plurality of first doped silicon gates and the plurality of portions of the second doped silicon gate are alternately arranged with each other; and
  a plurality of second metal gates disposed directly above the plurality of first doped silicon gates, respectively.

2. The semiconductor device of claim 1, wherein the first silicon oxide layer and the second silicon oxide layer are laterally coplanar with each other.

3. The semiconductor device of claim 1, wherein the first upper silicon layer is laterally coplanar with the plurality of first doped silicon gates and the second doped silicon gate.

4. The semiconductor device of claim 1, wherein the first metal gate is laterally coplanar with the plurality of second metal gates.

5. The semiconductor device of claim 1, wherein the first metal gate has a first length and a first width, and the plurality of first doped silicon gates and the plurality of portions of the second doped silicon gate collectively have a second length and a second width, the first length being substantially shorter than the second length, the first width being substantially narrower than the second width.

6. The semiconductor device of claim 1, further comprising a first source region and a first drain region disposed in the first upper silicon layer, the first source region and first drain region laterally disposed on opposite sides of the first metal gate.

7. The semiconductor device of claim 6, further comprising a second source region and a second drain region disposed in a portion of the second area of the lower silicon layer, the second source region and second drain region laterally disposed on opposite sides of the end-positioned ones of the plurality of portions of the second doped silicon gate.

8. The semiconductor device of claim 7, wherein the first upper silicon layer, the first source region, the first drain region, and the first metal gate collectively function as a first transistor, and the portion of the second area of the lower silicon layer, the second source region, the second drain region, the plurality of first doped silicon gates, and the second doped silicon gate collectively function as a second transistor.

9. The semiconductor device of claim 8, wherein the first transistor is operated under a first voltage, and the second transistor is operated under a second voltage, the second voltage being substantially higher than the first voltage.

10. The semiconductor device of claim 1, wherein the plurality of second metal gates are configured as dummy gates.

* * * * *